United States Patent
Yamamoto et al.

(10) Patent No.: US 7,248,061 B2
(45) Date of Patent: Jul. 24, 2007

(54) TRANSMISSION DEVICE FOR TRANSMITTING A SIGNAL THROUGH A TRANSMISSION LINE BETWEEN CIRCUITS BLOCKS HAVING DIFFERENT POWER SUPPLY SYSTEMS

(75) Inventors: Kiyoshi Yamamoto, Toyohashi (JP); Akitaka Murata, Toyohashi (JP); Tadashi Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 61 days.

(21) Appl. No.: 11/220,527

(22) Filed: Sep. 8, 2005

(65) Prior Publication Data

US 2006/0055379 A1 Mar. 16, 2006

(30) Foreign Application Priority Data

Sep. 14, 2004 (JP) ............................. 2004-266819
Oct. 21, 2004 (JP) ............................. 2004-306831
Apr. 28, 2005 (JP) ............................. 2005-132102

(51) Int. Cl.
*G01R 27/08* (2006.01)
*G05F 1/10* (2006.01)

(52) U.S. Cl. ...................... 324/705; 324/713; 327/540

(58) Field of Classification Search ................ 324/538, 324/537, 500, 605, 647, 656, 679, 705; 327/540, 327/541, 544; 333/154; 340/870.31, 870.37, 340/870.38
See application file for complete search history.

(56) References Cited

U.S. PATENT DOCUMENTS

| | | | | |
|---|---|---|---|---|
| 5,717,345 A | * | 2/1998 | Yokomizo et al. ............. | 326/80 |
| 6,025,946 A | * | 2/2000 | Miyamori et al. ........... | 398/185 |
| 6,313,662 B1 | | 11/2001 | Ide | |
| 6,452,405 B1 | * | 9/2002 | Collier-Hallman ........... | 324/713 |
| 2005/0140376 A1 | * | 6/2005 | Brown et al. ................ | 324/538 |
| 2006/0033509 A1 | * | 2/2006 | Awaji et al. ................ | 324/705 |
| 2006/0280112 A1 | * | 12/2006 | Fujii ........................... | 370/204 |

FOREIGN PATENT DOCUMENTS

| | | |
|---|---|---|
| JP | A-1-313773 | 12/1989 |
| JP | A-1-317007 | 12/1989 |
| JP | A-9-65456 | 3/1997 |
| JP | A-9-65499 | 3/1997 |
| JP | A-2000-269801 | 9/2000 |

* cited by examiner

*Primary Examiner*—Andrew H. Hirshfeld
*Assistant Examiner*—Hoai-An D. Nguyen
(74) *Attorney, Agent, or Firm*—Posz Law Group, PLC

(57) ABSTRACT

A transmission device includes a transmission line composed of first and second transmission lines. A first circuit block outputs a non-inverted transmission signal to the first transmission line, and a second output circuit outputs an inverted transmission signal to the second transmission line. The second circuit block comprises an impedance element and a comparison circuit for comparing voltages. The same types of impedance elements as the impedance element are interposed in the first and second transmission lines between the first circuit block and the second circuit block.

20 Claims, 17 Drawing Sheets

FIG. 9
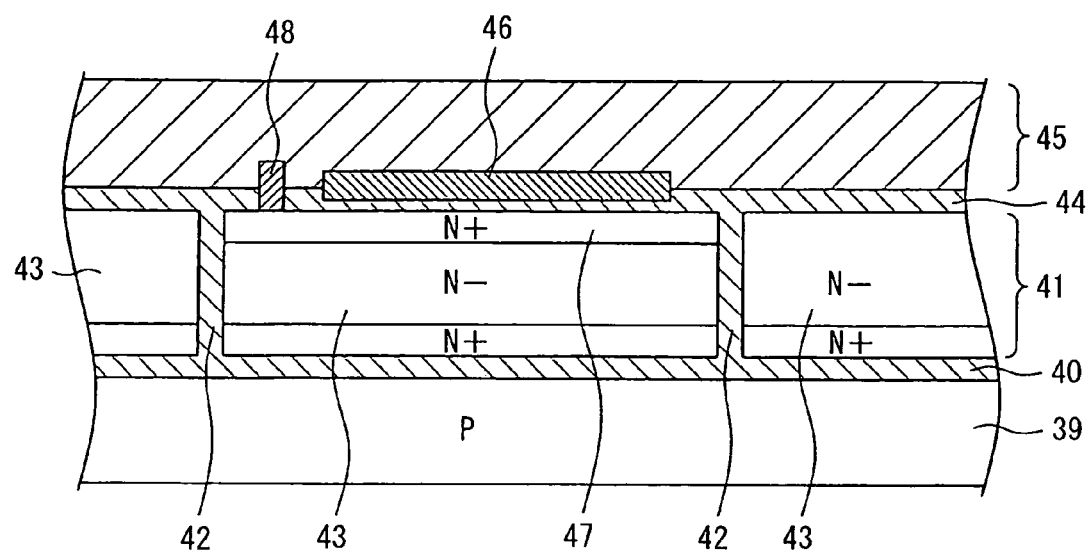
FIG. 10A  VG1
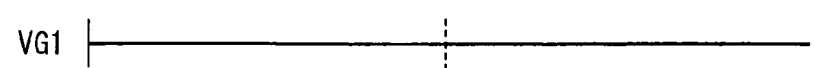
FIG. 10B  VG2
FIG. 10C  VA, VB
FIG. 10D  VC
FIG. 10E  VD
FIG. 10F  VE
FIG. 10G  VF
t1

TRANSMISSION DEVICE FOR TRANSMITTING A SIGNAL THROUGH A TRANSMISSION LINE BETWEEN CIRCUITS BLOCKS HAVING DIFFERENT POWER SUPPLY SYSTEMS

CROSS REFERENCE TO RELATED APPLICATIONS

This application is based upon, claims the benefit of priority of, and incorporates by reference the contents of Japanese Patent Application No. 2004-266819 filed on Sep. 14, 2004, Japanese Patent Application No. 2004-306831 filed on Oct. 21, 2004 and Japanese Patent Application No. 2005-132102 filed on Apr. 28, 2005.

TECHNICAL FIELD

The technical field relates generally to a transmission device for transmitting a signal through a transmission line between circuit blocks having different power supply systems and to a semiconductor integrated circuit for communications suitable designed to communicate by using a differential voltage signal between communication lines.

BACKGROUND

JP-A-1-317007 discloses a bus interface communication circuit for communicating by using a differential voltage signal between communication lines. When such a communication circuit is mounted in a vehicle, it is desired to design it as IC. However, when an in-vehicle LAN is constructed by using the communication circuit concerned, particularly when a safety system network containing a vehicle air bag system or the like is constructed, countermeasures for the case in which a communication line is short-circuited to a power supply line for the vehicle or a ground line are required.

JP-A-2000-269801 discloses an interface circuit in which integrated circuits are connected to each other through a transmission line and transmission/reception of data signals is carried out through one transmission line. An impedance device designed so that the terminal impedance thereof is changeable is provided between the transmission line and the power source. This impedance device acts to suppress occurrence of additive DC current.

When circuit blocks having different power supply systems are connected to each other through a transmission line, the potential relationship between both the power supply systems is varied by variation of the power supply systems due to external noise received, short-circuiting of the power supply lines to other potential sites or the like, thereby causing the transmission signals to be erroneously transmitted/received. Particularly when both the circuit blocks are different in ground potential and insulated from each other, the potential relationship therebetween is not settled, and thus it is impossible to transmit/receive the transmission signals normally.

SUMMARY

In view of the foregoing situation, it is an object to provide a transmission device that can normally transmit signals through a transmission line between circuit blocks having different power supply systems and to provide a semiconductor integrated circuit that can implement such a specification that the level of a differential voltage signal between a pair of communication lines is not influenced even when one of the pair of the communication lines is short-circuited to a power supply line or a ground line while at the same time reducing cost.

Accordingly, a power source of a first integrated circuit portion provided with a transceiver portion for carrying out communications using a differential voltage signal between a pair of communication lines is supplied from a floating power source which is maintained to be insulated from the power supply line and the ground line, and thus even when one of the signal line pair is short-circuited to the power supply line or the ground line, the potential difference itself between the signal lines constituting the pair is not varied, and thus no effect is imposed on the level of the differential voltage signal between the communication line pair. In this case, the first integrated circuit portion and the second integrated circuit portion provided with the protocol controller for the communication operation are manufactured as devices each having an insulating separation type structure, and thus a wraparound path extending through a substrate like a PN junction separation type structure is not formed. Accordingly, the first integrated circuit portion and the second integrated circuit portion can be formed on the same semiconductor chip to thereby implement a one-chip structure, and thus the cost can be reduced.

A coupling capacitor may be formed by using a circuit constituent material in the semiconductor chip, thereby promoting the one-chip design, so that the reduction of the cost can be implemented.

A filter capacitor may be formed by using a circuit constituent material in the semiconductor chip, thereby promoting the one-chip design, so that the further reduction of the cost can be implemented.

The first integrated circuit portion may also supplied with power from a flowing power source. Therefore, even when one of the pair of the signal lines is short-circuited to the power supply line or the ground line, the level of the differential voltage signal between the paired communication lines is not influenced. Furthermore, the first integrated circuit portion and the second integrated circuit portion are manufactured as devices each having the insulating separation type structure. Therefore, the one-chip structure can be implemented by forming the coupling capacitors in the first integrated circuit portion and the second integrated circuit portion, so that the cost can be reduced.

The one-chip structure in which the filter capacitors are also formed in the first integrated circuit portion and the second integrated circuit portion can be implemented, thereby further reducing the cost.

The first integrated circuit portion is designed to be supplied with power from the floating power source. Therefore, even when one of a pair of signal lines is short-circuited to a power supply line or a ground line, the level of a differential voltage signal between the pair of communication lines is not influenced. Furthermore, the first integrated circuit portion and the second integrated circuit portion are manufactured as devices each having an insulating separation type structure. Therefore, at least one of a coupling capacitor and a filter capacitor can be formed in the first integrated circuit portion or a second integrated circuit portion, so that the one-chip structure can be implemented and the cost can be reduced.

Accordingly, a first circuit block and a second circuit block that have different power supply systems are connected to each other through a first transmission line and a second transmission line, and an impedance element (capacitor, a resistor or the like) is interposed in each transmission line. Accordingly, when the impedance element is a capacitor, both the circuit blocks are enabled to transmit signals while being perfectly insulated from each other.

When the first circuit block outputs a non-inverted signal and an inverted signal of a transmission signal to the first transmission line and the second transmission line respectively, the differential signal therebetween is applied to a series circuit comprising the impedance element interposed in the first transmission line, an impedance element connected between the first transmission line and the second transmission line (hereinafter referred to as an inter-line impedance element) and the impedance element interposed in the second transmission line, and a divided voltage occurs between the terminals of the inter-line impedance element. The direction of the divided voltage is determined by the magnitude relationship between the voltage of the non-inverted signal and the voltage of the inverted signal output from the first circuit block, that is, the logic of the transmission signal (H level/L level).

As described above, the direction of the voltage between the terminals of the inter-line impedance element is determined by the direction of the differential output voltage of the first circuit block located at the transmission side in the one closed impedance-element series circuit. In addition, when the impedance element is a capacitor, it has a filter action (integration action) for removing noises or the like, and thus even when external noise is received or the power source potential of each circuit block is varied, there occurs no such malfunction that the direction of the voltage between the terminals of the inter-line impedance element is inverted. Accordingly, even when the potential relationship between both the circuit blocks is varied or is not settled, signals can be surely transmitted from the first circuit block to the second circuit block by comparing the voltages at both the terminals of the inter-line impedance element through a comparison circuit provided to the second circuit block to achieve a transmitted signal.

A reference potential of the second power supply system may be applied to the inter-line impedance element, and thus even under a transit state that the potential relationship between the first circuit block and the second circuit block is varied by noise or the like, the magnitude relationship of the voltages input to the comparison circuit can be easily kept. Accordingly, even when the potential between both the circuit blocks is varied, signals can be transmitted from the first circuit block to the second circuit block with no error. Furthermore, the input voltages to the comparison circuit can be set within the in-phase input voltage range of the comparison circuit.

Even under a transient state that the potential relationship between the first circuit block and the second circuit block is varied, a magnitude relationship between one input voltage of the comparison circuit which is determined by the output voltage of the first output circuit and the reference potential of the second circuit block and the other input voltage of the comparison circuit which is determined by the output voltage of the second output circuit and the reference potential of the second circuit block is properly maintained. Therefore, signals can be further surely transmitted from the first circuit block to the second circuit block.

First to N-th (N>3) impedance elements may be connected to one another in series between the output terminal of the first output circuit operating under a first power supply system and the output terminal of the second output circuit, and a comparison circuit operating under a second power supply compares voltages at both the terminals of any one impedance of second to (N−1)-th impedance elements or at both the terminals of a group of two or more impedance elements connected in series of the second to the (N−1)-th impedance elements to achieve a transmitted signal. As described above, plural impedance elements are connected in series and made to function as a single impedance element, whereby a withstanding voltage has a margin and IC design can be easily performed.

The transmission device may be constructed as a semiconductor integrated circuit device having a trench insulating separation structure that has a semiconductor layer on a support substrate so that the semiconductor layer is insulated from the support substrate, and in which plural element forming areas are formed in the semiconductor layer so as to be sectioned like islands by insulating separation trenches. Furthermore, an insulating film which is formed on the semiconductor layer as a dielectric material between the electrodes of a capacitor by an oxide film separating process is used, and thus leakage current under high temperature can be more greatly reduced as compared with a capacitor formed by a junction separation process. Both the terminal portions of the inter-line capacitor have high impedance, and thus deterioration of transmission signals can be improved by reducing the leakage current. Furthermore, parasitic capacitance can be also reduced, and thus deterioration of signals occurring through the transmission can be suppressed.

The electrodes of the capacitor may be constructed by a conductive film (metal pattern of Al or the like, polysilicon film or the like) and a diffusion layer in the semiconductor layer, and a buffer area which is insulated and supplied with predetermined potential is formed between an element forming area where the capacitor is formed and another element forming area. Therefore, signal propagation through the coupling capacitance between the neighboring element forming areas can be suppressed, and deterioration of transmission signals can be improved.

The electrodes of the capacitance are constructed by a pair of conductive films formed on the semiconductor layer, and the capacitor is sandwiched between a shield conductive layer (metal pattern of Al or the like, polysilicon film or the like) formed on the semiconductor layer and a diffusion layer in the semiconductor layer. As described above, both the terminal portions of the inter-line capacitor have high impedance, however, predetermined potential is applied to the shield conductive layer and the diffusion layer in the semiconductor layer under the operating state. Therefore, variation of the divided voltage of the inter-line capacitance due to invasion of noise or the like can be suppressed by the shield action.

The electrodes of the capacitor may be constructed by a pair of conductive films formed on the semiconductor layer, and the capacitor is sandwiched between a pair of shield conductive layers formed on the semiconductor layer. Predetermined potential is applied to the shield conductive layers under the operating state, and thus the shield action can be achieved as in the case of the above means.

The transmission device may be constructed as a semiconductor integrated circuit device that is equipped with a support substrate and a semiconductor layer formed on the support substrate so as to be insulated from the support substrate and also has a trench insulating separation structure that plural element forming areas are formed in the semiconductor layer so as to be insulated and sectioned like islands by element separating areas. A plurality of semiconductor areas which are insulated from one another and sectioned like islands are formed in the semiconductor layer, and the capacitors are formed while the semiconductor areas are set as electrodes and the element separating area provided between the semiconductor areas is set as a dielectric material. According to this construction, the withstanding voltage or electrostatic capacitance of the capacitor can be increased by increasing the planar dimension.

The semiconductor areas may be continuously (for example, in a matrix form) formed in the semiconductor layer, and the capacitors are formed so that unit capacitors constructed by neighboring semiconductor areas are connected to one another in series-parallel. Therefore, the series connection number can be increased and the withstanding voltage can be increased by increasing the planar dimension.

The impedance element may be constructed by a thin film resistor or a polycrystalline silicon resistor which has small parasitic capacitance, and thus signal transmission can be performed stably and at high speed.

BRIEF DESCRIPTION OF THE DRAWINGS

FIG. 9 is a cross-sectional view showing capacitors constructed as IC;

FIGS. 10A–10G are diagrams showing voltage waveforms of ground potential and respective signals in a transmission circuit;

FIGS. 15A–15B show a twelfth embodiment, wherein FIG. 15A is a cross-sectional view of capacitors constructed as IC, and FIG. 15B is a longitudinally-sectional view taken along line XVB—XVB of FIG. 15A;

FIGS. 16A–16B show a thirteenth embodiment, wherein FIG. 16A is a cross-sectional view of capacitors constructed as IC, and FIG. 16B is a longitudinally-sectional view taken along line XVIB—XVIB of FIG. 16A;

BRIEF DESCRIPTION OF EMBODIMENTS

Recently, a bus standard concerning networking of a passenger safety system for vehicles has been proposed by Safe-by-Wire Plus (registered trademark) consortium. According to this standard, there is adopted a circuit construction which is designed so that even when one communication line of a pair of communication lines is short-circuited to a power supply line or a ground line, the level of a differential voltage signal between the communication lines concerned is not influenced.

Figure 7:
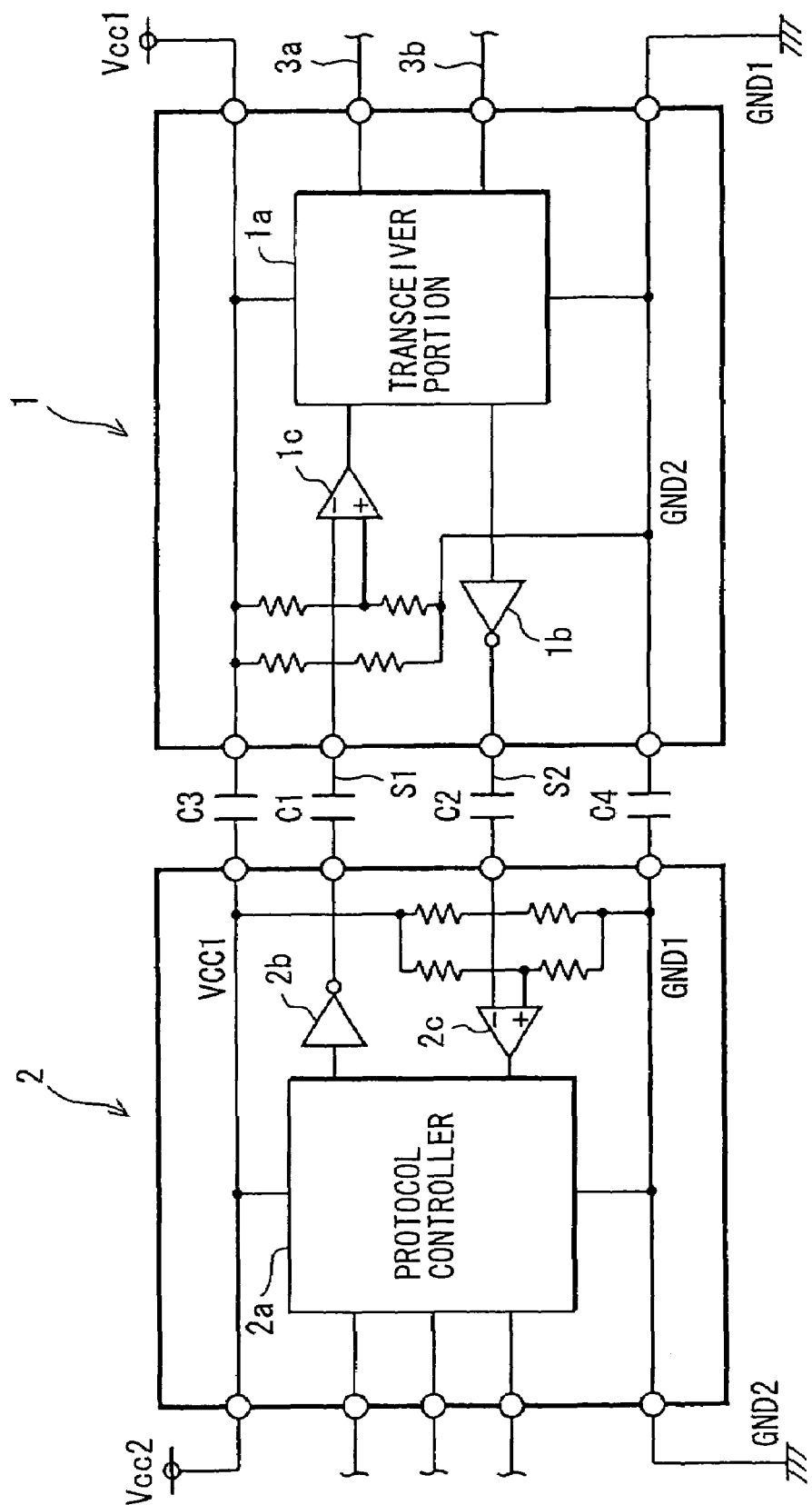
FIG. 7 is a diagram showing the circuit construction to explain a technical problem.

FIG. 7 schematically shows the construction of a communication semiconductor integrated circuit which is expected to be applicable to the bus standard as described above. A semiconductor integrated circuit shown in FIG. 7 is constructed by combining an integrated circuit (IC) 1 constituting a driver portion and another integrated circuit (IC) 2 constituting a protocol portion.

IC1 comprises a transceiver portion 1a for carrying out a communication operation with a subordinate circuit such as a squib driver IC for an air bag by using a differential voltage signal between a pair of communication lines 3a and 3b, an output circuit 1b (buffer circuit) for outputting a signal from the transceiver portion 1a to a signal line S2, and an input circuit 1c (containing a comparator, a voltage dividing circuit for generating a comparison voltage, etc.) for supplying a signal input through a signal line S1 to the transceiver portion 1a.

IC2 comprises a protocol controller 2a for receiving/delivering data with a superordinate circuit such as a host computer or the like, an output circuit 2b (buffer circuit) for outputting a signal from the protocol controller 2a to the signal line S1, and an input circuit 2c (comparator, a voltage dividing circuit for generating a comparison voltage, etc.) for supplying a signal input through the signal line S2 to the protocol controller 2a.

In this case, a power source for IC1 is provided between a power supply terminal Vcc1 and a ground terminal GND1, and a power source for IC2 is provided between a power supply terminal Vcc2 of a power supply system different from the power source for IC1 and a ground terminal GND2.

Accordingly, with respect to the semiconductor integrated circuit having IC1 and IC2 which are supplied with power from the different power supply systems as described above, in a case where the power supply terminal Vcc1 and the ground terminal GND1 are set as a floating power source, even when one of communication lines 3a and 3b is short-circuited to a vehicle power supply line and a ground line, the level of the differential voltage signal between the communication lines 3a and 3b is not influenced.

When signal transmission is carried out between IC1 and IC2 which are different in power source as described above, coupling capacitors C1 and C2 are inserted into the signal lines S1 and S2 for connecting IC1 and IC2. Furthermore, in order to prevent malfunction caused by EMI noise, it is required to insert filter capacitors C3 and C4 between the power supply terminals Vcc1 and Vcc2 of IC1 and IC2 and between the ground terminals GND1 and GND2, respectively.

When the semiconductor integrated circuit thus constructed is manufactured, in order to reduce the cost, it is desirable to implement a one-chip design in which the coupling capacitors C1, C2 and the filter capacitors C3 and C4 are installed in IC1 or IC2, or a whole one-chip design in which all the devices containing IC1 and IC2 and the respective capacitors C1 to C4 are subjected to one-chip design. However, since the semiconductor integrated circuit described above is generally designed as a PN-junction separation type, formation of a leakage path extending through a substrate is unavoidable. Therefore, the one-chip design of IC1 and IC2 is impossible, and also the capacitors C1 to C4 must be provided as an external circuit, so that it is difficult to reduce the cost.

First Embodiment

A first embodiment applied to a semiconductor integrated circuit used for a sub network for in-vehicle mount LAN will be described with reference to FIG. 1.

Figure 1:
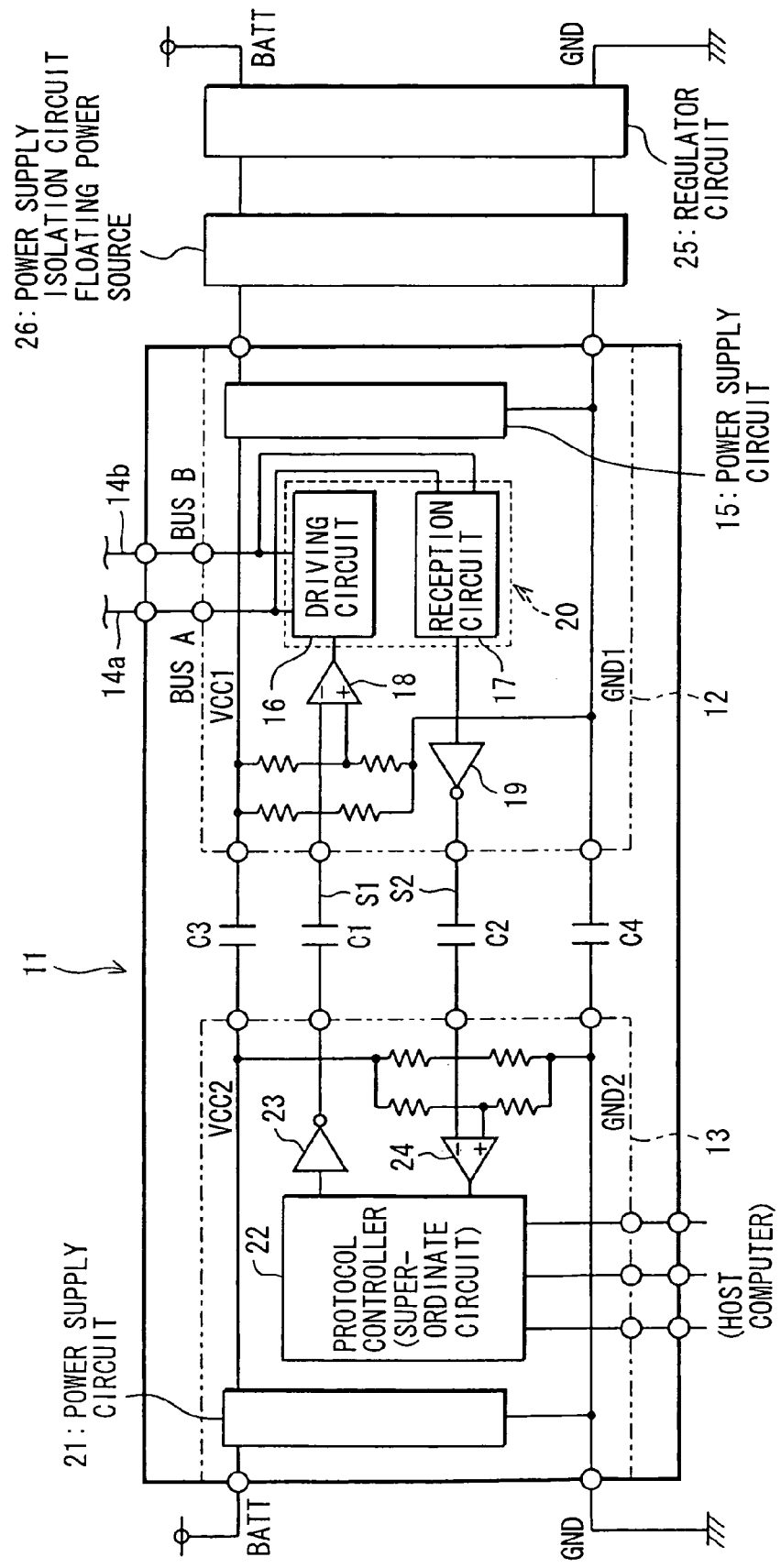
FIG. 1 is a diagram showing the circuit construction of a first embodiment.

In FIG. 1, a master IC 11 (corresponding to a semiconductor integrated circuit) is constructed as a device having an insulating separation type structure using an SOI substrate, for example, and it is designed so that a driver portion 12 (corresponding to the first integrated circuit portion) and a protocol portion 13 (corresponding to the second integrated circuit portion) are formed on the same semiconductor chip.

The driver portion 12 carries out a communication operation with a slave IC (for example, a squib driver IC for an air bag, for example) (not shown) by using a differential voltage signal between a pair of communication lines 14a and 14b connected to buses A and B. Specifically, the driver portion 12 comprises a power supply circuit 15, a driving circuit 16 for outputting the differential voltage signal corresponding to transmission data to the slave IC between the communication lines 14a, 14b, a reception circuit 17 for receiving data transmitted from the slave IC to the communication lines 14a and 14b, an input circuit 18 (containing a comparator, a voltage dividing circuit for generating a comparison voltage, etc.) for applying a signal input through a signal line S1 to the driving circuit 16, and an output circuit 19 (buffer circuit) for outputting reception data of the reception circuit 17 to a signal line S2. The transceiver portion 20 is preferably constructed by the driving circuit 16 and the reception circuit 17.

The protocol portion 13 comprises a power supply circuit 21, a protocol controller 22 for receiving/delivering data with a superordinate circuit such as a host computer (not shown), an output circuit 23 (buffer circuit) for outputting a signal from the protocol controller 22 to the signal line S1, and an input circuit 24 (containing a comparator, a voltage dividing circuit for generating a comparison voltage) for applying a signal input through the signal line S2 to the protocol controller 22.

In this case, the power supply circuit 15 of the driver portion 12 is connected so as to be supplied with power from a power supply line BATT connected to an in-vehicle mount battery and a ground line GND through a regulator circuit 25 and a power supply isolation circuit 26 (corresponding to a floating power source). The power isolation circuit 26 is constructed to supply power to the power supply circuit 15 while keeping the electrical insulation between the power supply circuit 15 and each of the power supply line BATT and the ground line GND. Furthermore, the power supply circuit 21 of the protocol portion 13 is connected to be directly supplied with power from the power supply line BATT and the ground line GND.

In order to carry out the signal transmission between the driver portion 12 and the protocol portion 13 between which the power source is different, coupling capacitors C1 and C2 are inserted in the signal lines S1 and S2 through which the driver portion 12 and the protocol portion 13 are connected to each other. In order to prevent malfunction caused by EMI noise, capacitors C3 and C4 for filter are inserted between the power supply lines VCC1 and VCC2 and between the ground lines GND1 and GND2 in the driver portion 12 and the protocol portion 13.

In this case, the capacitors C1 to C4 are formed on the semiconductor chip for the master IC 11 by using circuit constituent material. Specifically, they may be achieved by using polysilicon film used for the master IC 11 insofar as the capacitance components of the capacitors C1 to C4 are equal to about several tens pF. If the capacitance components are equal to about several pF, they can be achieved by the inter-wire capacitance (for example, the capacitance between a first layer aluminum wire and a second layer aluminum wire).

In short, in the master IC 11 thus constructed, the power of the driver portion 12 constructed to contain the transceiver portion 20 for carrying out communications using the differential voltage signal between the paired communication lines 14a and 14b is supplied from the power supply isolation circuit 26 which is kept to be isolated from the power supply line BATT and the ground line GND. Therefore, even when one of the communication lines 14a and 14b is short-circuited to the power supply line BATT or the ground line GND, the potential difference itself between the communication lines 14a and 14b is not varied, and thus the level of the different voltage signal between the communication lines 14a and 14b is not influenced, so that the communications with the slave IC (not shown) can be normally performed.

In this case, the master IC 11 equipped with the driver portion 12 and the protocol portion 13 described above is manufactured as a device having an insulating separation type structure, and thus there is not formed any wraparound path passing through the substrate like the PN junction separation type structure. Accordingly, the one-chip structure that the driver portion 12 and the protocol portion 13 are formed on the same semiconductor chip can be implemented, and thus the cost can be reduced. Furthermore, in the semiconductor chip constituting the master IC 11, the coupling capacitors C1 and C2 and the filtering capacitors C3 and C4 are formed by using the circuit constituent material in the semiconductor chip concerned, and thus the cost can be further reduced.

Second Embodiment

Figure 2:
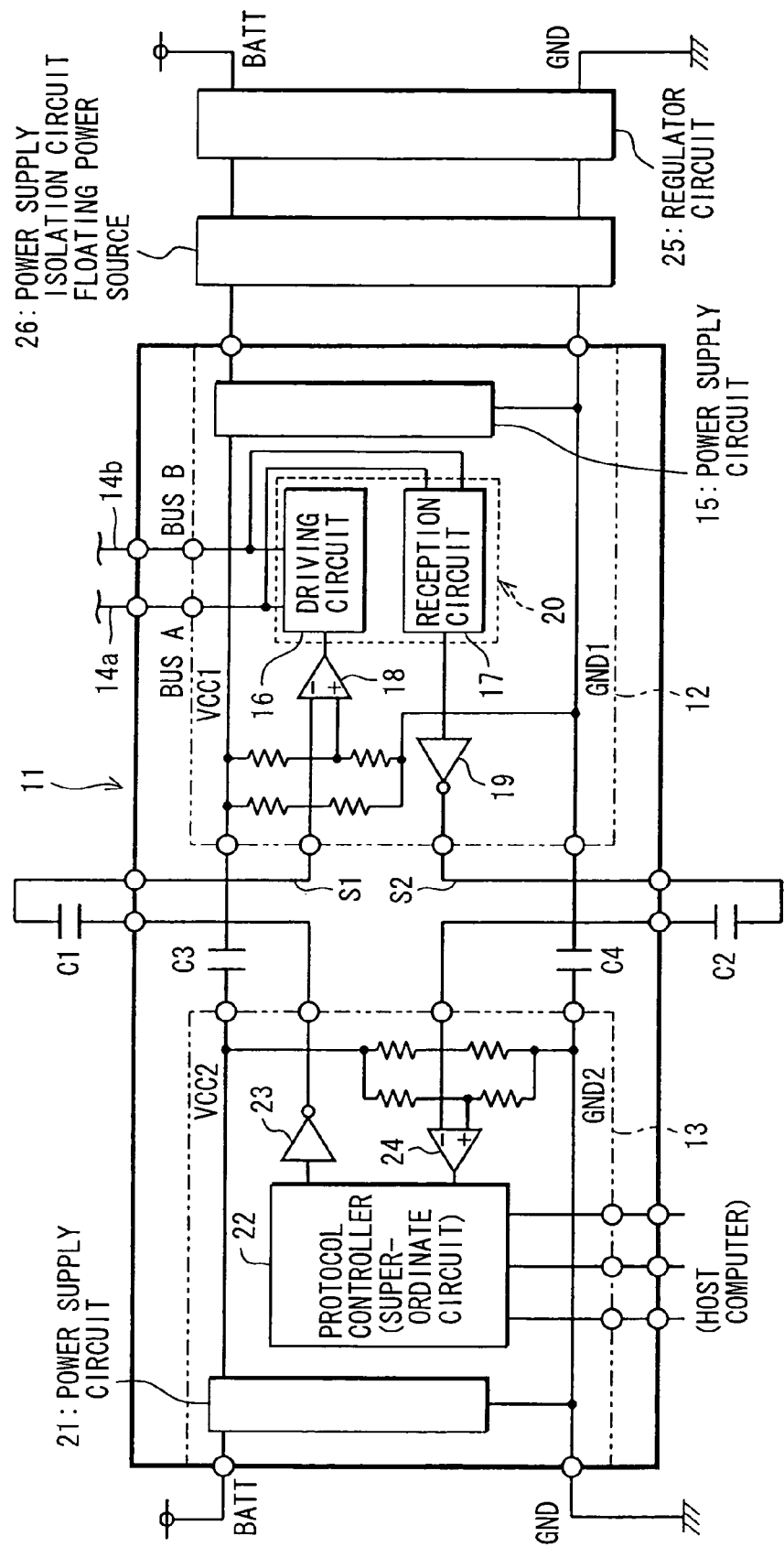
FIG. 2 is a diagram showing the circuit construction of a second embodiment.

FIG. 2 shows a second embodiment that has the same effect as the first embodiment, and only the different portion from the first embodiment will be described hereunder.

The second embodiment is applicable to an example in which the capacitance of each of the coupling capacitors C1, C2 exceeds 100 pF, that is, when it is difficult to form the coupling capacitors C1, C2 on the semiconductor chip for the master IC 11. As shown in FIG. 2, in such a case, the coupling capacitors C1 and C2 may be disposed as externally-equipped capacitors.

Third Embodiment

Figure 3:
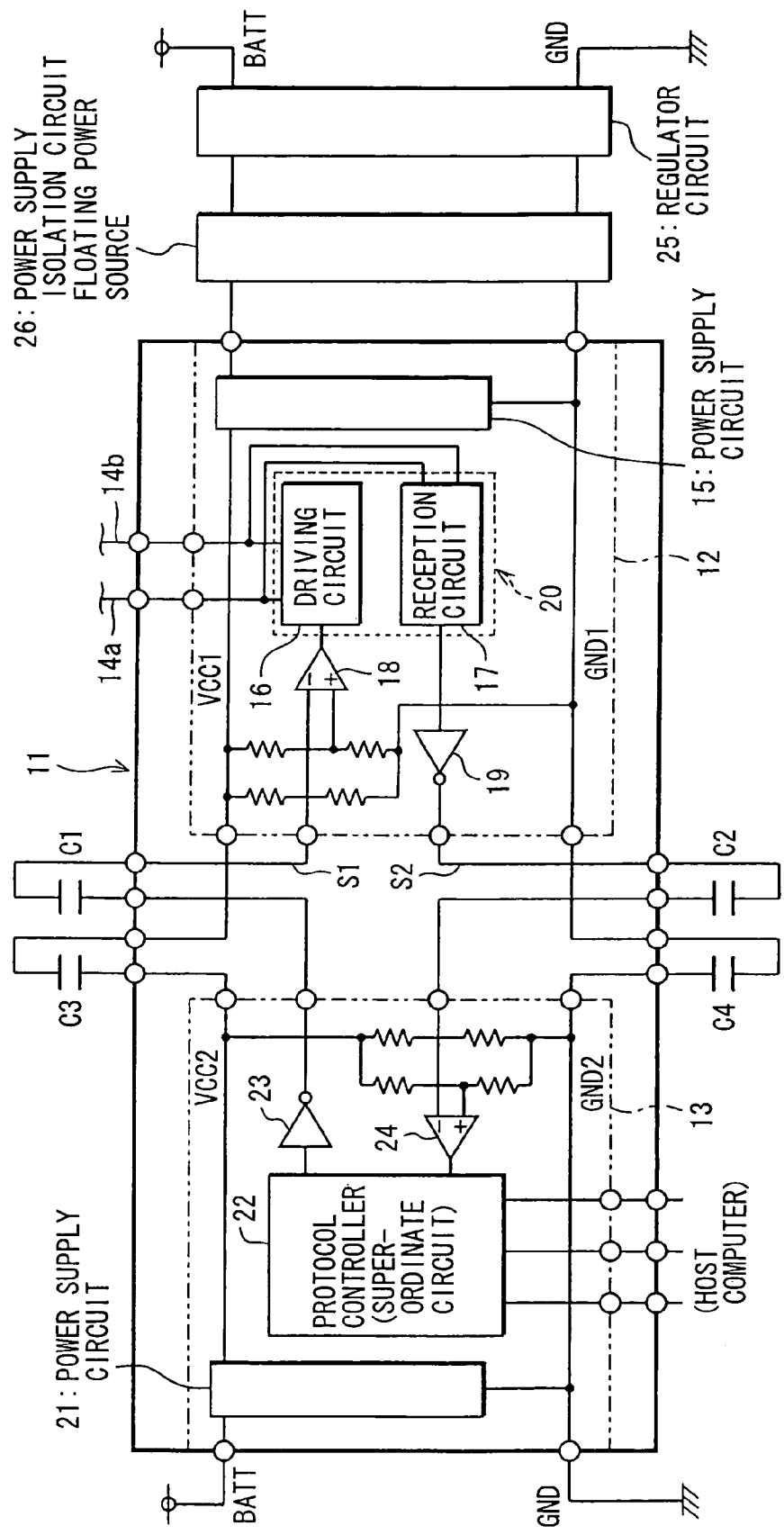
FIG. 3 is a diagram showing the circuit construction of a third embodiment.

FIG. 3 shows a third embodiment that has the same effect as the first embodiment, and only the different portion from the first embodiment will be described hereunder.

The third embodiment is an example in which both the capacitance of the coupling capacitors C1, C2 and the capacitance of the filter capacitors C3, C4 exceed 100 pF. That is, it is difficult to form the coupling capacitors C1, C2 and the filter capacitors C3, C4 on the semiconductor chip for the master IC 11. As shown in FIG. 3, the coupling capacitors C1 and C2 and the filter capacitors C3 and C4 are disposed as externally-equipped capacitors.

Fourth Embodiment

Figure 4:
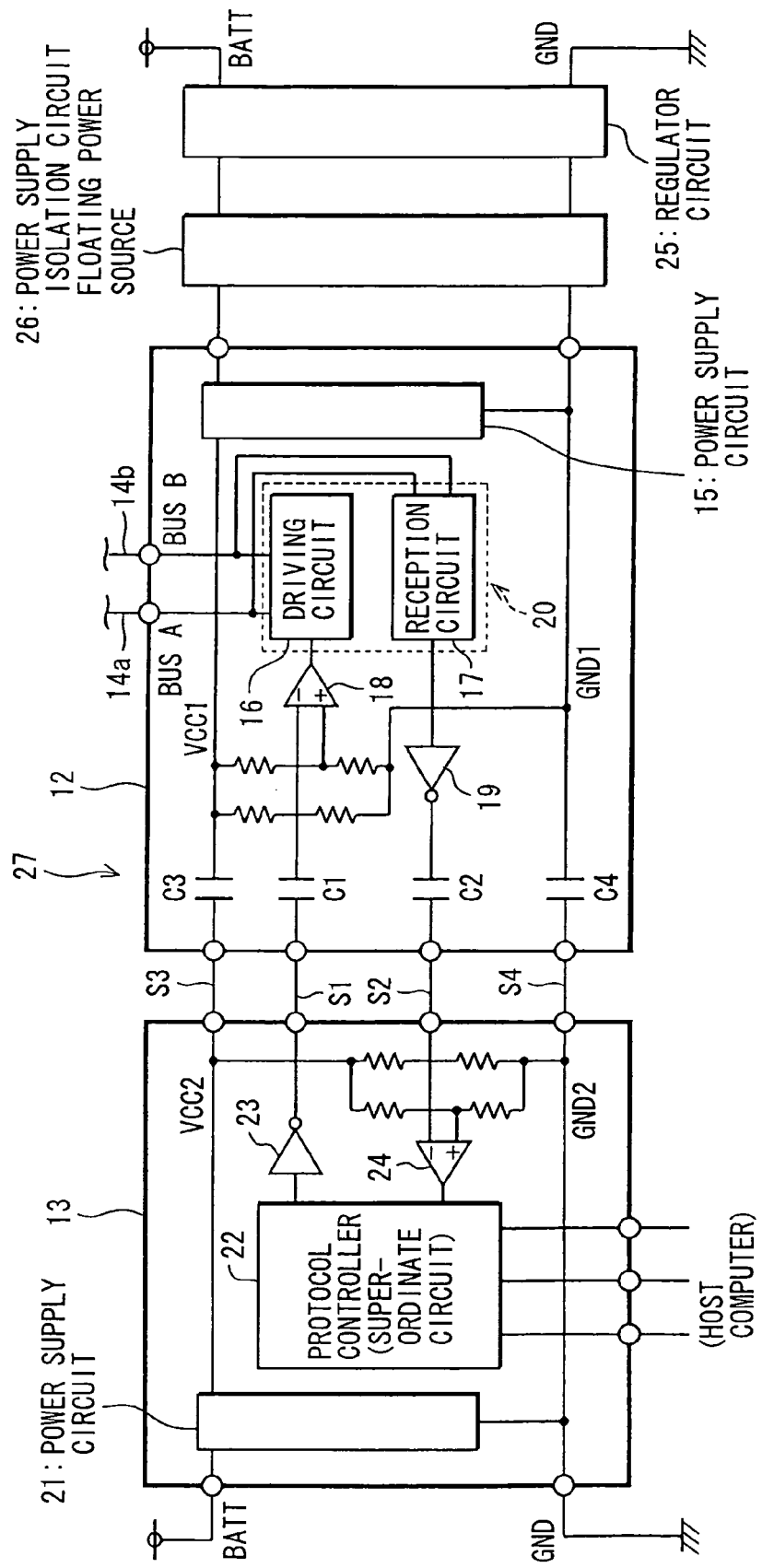
FIG. 4 is a diagram showing the circuit construction of a fourth embodiment.

FIG. 4 shows a fourth embodiment that has the same effect as the first embodiment, and only the different portion from the first embodiment will be described hereunder.

In the fourth embodiment, the driver portion 12 and the protocol portion 13 are manufactured as IC of different chips, and the driver portion 12 and the protocol portion 13 are connected to each other through the signal lines S1 and S2, thereby constructing an IC unit 27 (corresponding to a semiconductor integrated circuit) functioning as a master of a slave IC (not shown). In this case, the coupling capacitors C1, C2 are formed by using the circuit constituent material in the driver portion 12 in the form of one-chip. Furthermore, the filter capacitors C3, C4 are formed by using the circuit constituent material in the driver portion 12 in the form of one-chip. However, with respect to the filter capacitors C3 and C4, respective one terminals of these capacitors are connected to the power supply line VCC1 and the ground line GND1 of the driver portion 12 respectively, and the other terminals are connected to the power supply line VCC2 and the ground line GND2 of the protocol portion 13 through auxiliary lines S3 and S4 for connecting the driver portion 12 and the protocol portion 13, respectively. All or some of the coupling capacitors C1, C2 and the filter capacitors C3, C4 may be formed by using the circuit constituent material in the protocol portion 13.

Fifth Embodiment

Figure 5:
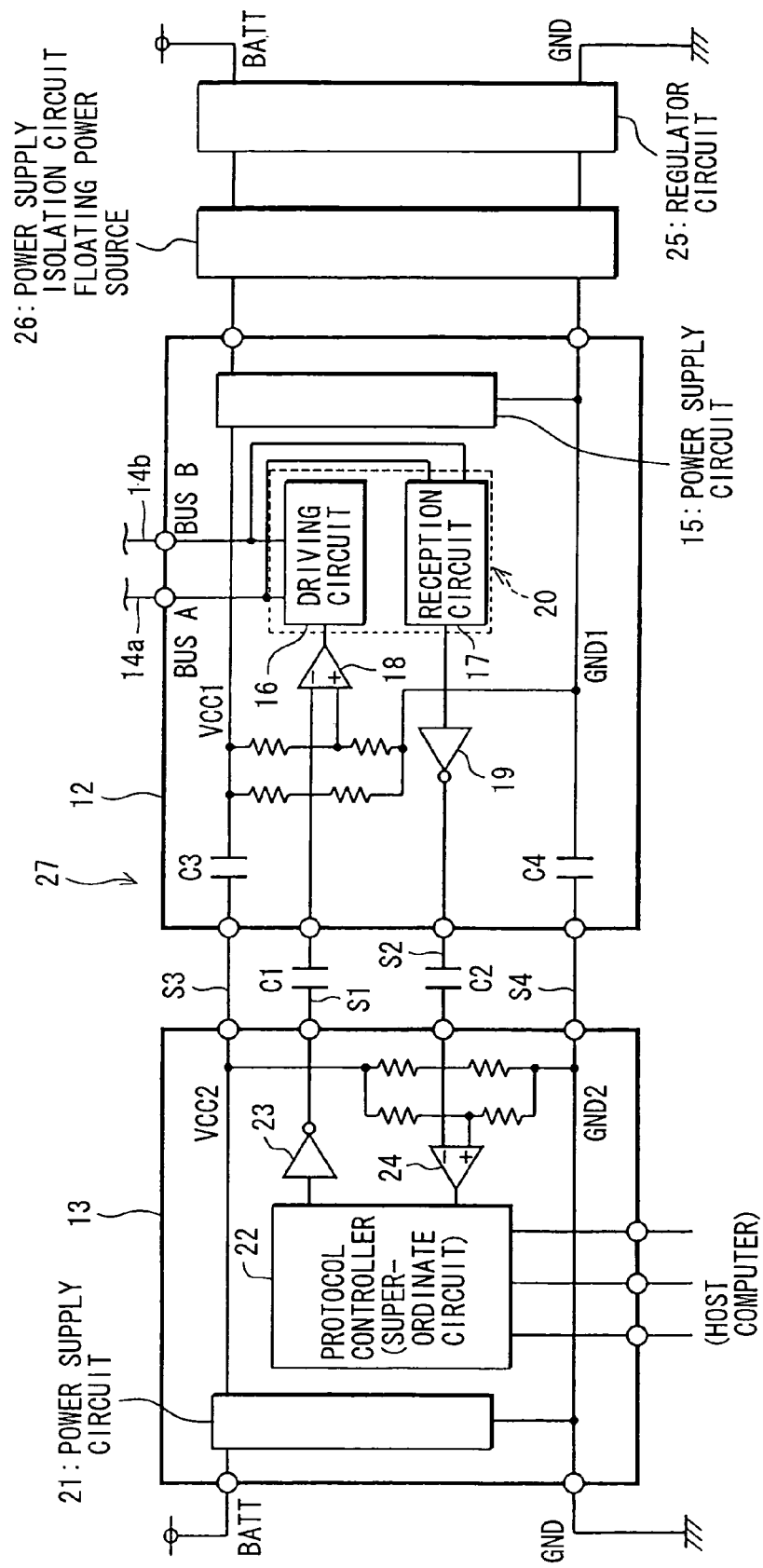
FIG. 5 is a diagram showing the circuit construction of a fifth embodiment.

FIG. 5 shows a fifth embodiment in which the fourth embodiment described above is modified, and only the different portion from the third embodiment will be described hereunder.

The fifth embodiment is an example in which the capacitance of each of the coupling capacitors C1, C2 exceeds 100 pF, that is, in which it is difficult to form the coupling capacitors C1 and C2 in the driver portion 12 or the protocol portion 13. As shown in FIG. 5, the coupling capacitors C1, C2 are provided as externally-equipped capacitors inserted in the signal lines S1 and S2 for connecting the driver portion 12 and the protocol portion 13. It is possible to form the coupling capacitors C1 and C2 in the driver portion 12 or the protocol portion 13. However, when it is difficult to form the filter capacitors C3 and C4 in the driver portion 12 or the protocol portion 13, the filter capacitors C3 and C4 are disposed as externally-equipped capacitors.

Sixth Embodiment

Figure 6:
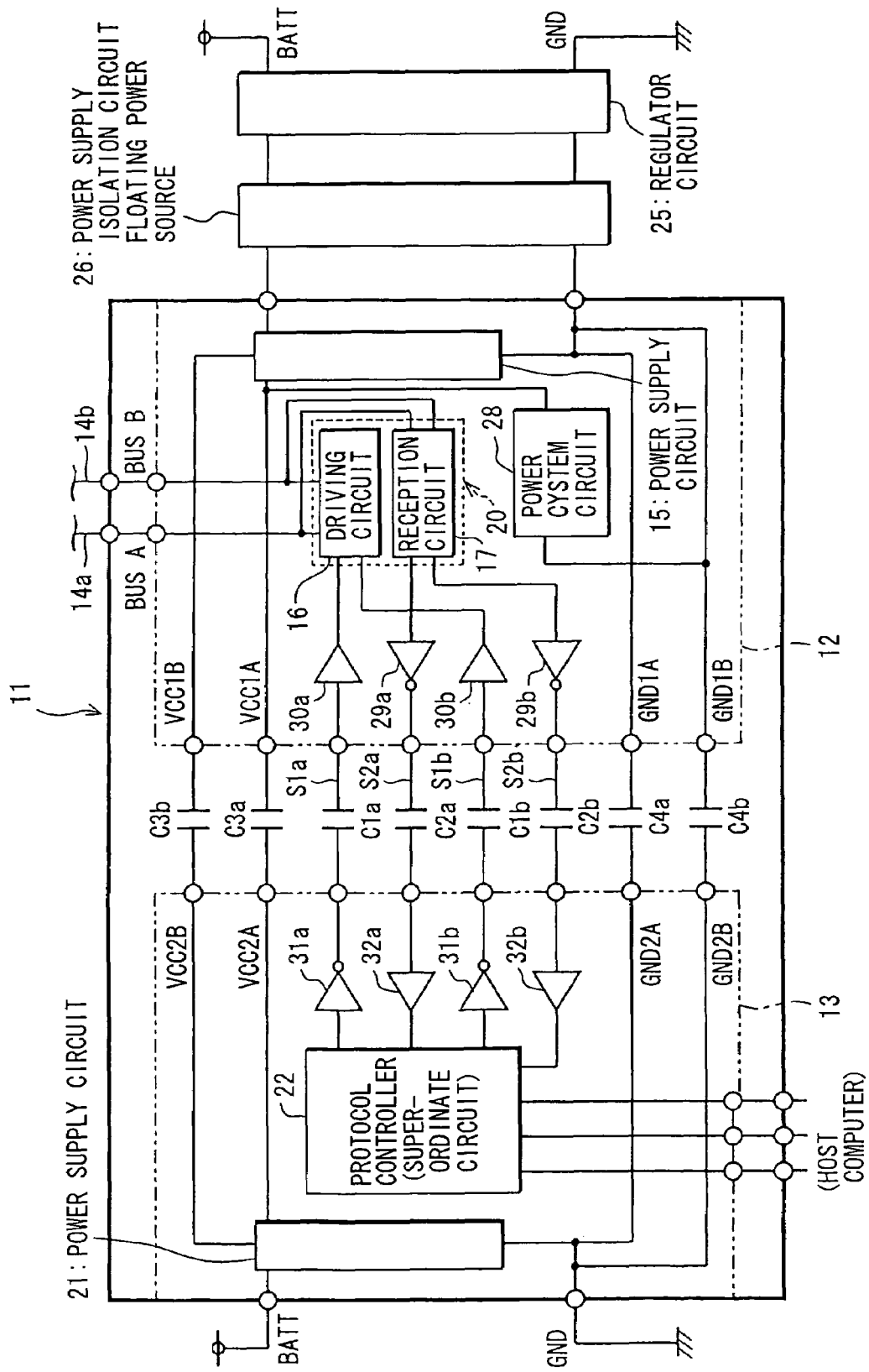
FIG. 6 is a diagram showing the circuit construction of a sixth embodiment.

FIG. 6 shows a sixth embodiment that has the same effect as the first embodiment, and only the different portion from the first embodiment will be described.

That is, in the sixth embodiment, power supply voltages of two systems are needed in the driver portion 12 and the protocol portion 13 of the master IC 11.

In FIG. 6, the power supply circuit 15 provided to the driver portion 12 has power supply lines VCC1A and VCC1B different in output voltage. It supplies power for the driving circuit 16, the reception circuit 17, etc. between the power source line VCC1A at the lower voltage side and the ground line GND1A, and also supplies power for a power system circuit 28 between the power supply line VCC1B at the high voltage side and the ground line GND1B. Furthermore, the power supply circuit 21 provided to the protocol portion 13 has power supply lines VCC2A and VCC2B different in output voltage. It supplies power for the protocol controller 22, etc. between the power supply line VCC2A at the low voltage side and the ground line GND2A, and also supplies power for an internal circuit (not shown) between the power supply line VCC2B at the high voltage side and the ground line GND2B. In this case, output circuits 29a, 29b and input circuits 30a, 30b of the two systems are connected to the transceiver portion 20 at the driver portion 12 side, and output circuits 31a, 31b and input circuits 32a, 32b of the two systems are connected to the protocol controller 22 at the protocol portion 13 side.

Coupling capacitors C1a, C1b, C2a, C2b are inserted in signal lines S1a, S1b, S2a, S2b through which the driver portion 12 and the protocol portion 13 are connected to each other, and filter capacitors C3a, C3b, C4a, C4b are inserted between the power supply lines VCC1A and VCC2A in the driver portion 12 and the protocol portion 13, between VCC1B and VCC2B, between the ground lines GND1A and GND2A and between GND1B and GND2B, respectively. In this case, the capacitors C1a, C1b, C2a, C2b, C3a, C3b, C4a, C4b are formed of the circuit constituent material on the semiconductor chip for the master IC 11.

Seventh Embodiment

A seventh embodiment will be described with reference to FIGS. 8 to 11.

Figure 8:
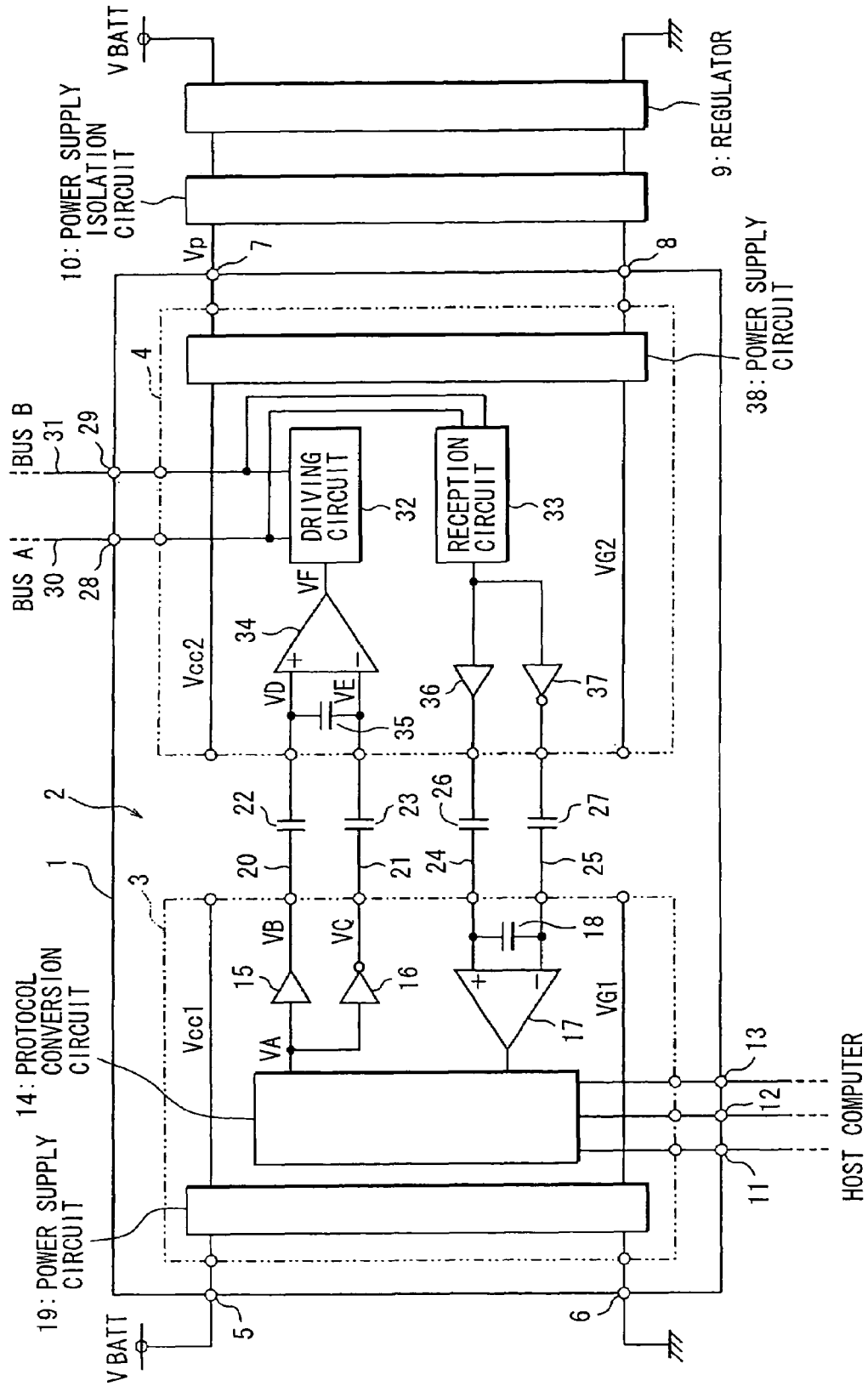
FIG. 8 is a diagram showing the electrical construction of a communication IC according to a seventh embodiment.

FIG. 8 is a diagram showing the electrical construction of a communication circuit constructed as a semiconductor integrated circuit device (IC) for a vehicle air bag system. This IC1 carries out communications using a communication protocol Safe-by-Wire (registered trademark) used for a collision detecting sensor and a sub network exclusively-used for an air bag for the purpose of reducing harnesses and enhancing collision detecting performance and safety. This communication system is a power superposing system and thus the number of harnesses is reduced. Furthermore, it adopts a time slot communication system, and thus it is warranted that a transmission message is certainly transmitted within a fixed time.

A communication circuit 2 mounted in this IC1 comprises a protocol conversion portion 3 and a transceiver 4 which are insulated from each other and have different power supply systems. The circuit construction related to the data transmission between the protocol conversion portion 3 (correspond to the first or second circuit block) and the transceiver 4 (corresponding to the second or first circuit block) preferably constitutes the transmission device. The transmission circuit has two systems of a transmission system for transmitting signals from the protocol conversion portion 3 to the transceiver 4, and a transmission system for transmitting signals from the transceiver 4 to the protocol conversion portion 3, and it can carry out two-way transmission.

A battery voltage VBATT serving as a first power supply voltage is applied from a battery (not shown) through the terminals 5 and 6 to the protocol conversion portion 3. The protocol conversion portion 3 uses a ground line having the common potential to a microcomputer IC (not shown) serving as a host. The transceiver 4 is kept to be floated with respect to the microcomputer IC, and a second power supply voltage Vp is applied to the transceiver 4 through terminals 7 and 8 of IC1. The power supply voltage Vp is generated by a non-insulated type boosting regulator 9 having the battery voltage VBATT as an input, and supplied to the terminals 7 and 8 through the power supply isolation circuit 10.

The protocol conversion portion 3 is a circuit block that is connected to the microcomputer IC through the terminals 11 to 13 of IC1 and carries out protocol conversion on transmission/reception data transmitted/received to/from the microcomputer IC. The protocol conversion portion 3 comprises a protocol conversion circuit 14, output circuits 15, 16, a comparator 17, a capacitor 18 and a power supply circuit 19. The power supply circuit 19 is a non-insulated voltage drop type linear regulator, and drops the battery voltage VBATT to generate a power supply voltage Vcc1 (for example, 5V) for operating the whole of the protocol conversion portion 3.

The protocol conversion circuit 14 carries out the protocol conversion on transmission data input from the microcomputer IC, and outputs the transmission signal thus converted to the output circuits 15, 16. In addition, it performs the protocol conversion on reception data input from the comparator 17 and transmits the reception data thus converted to the microcomputer IC.

The output circuit 15 (corresponding to the first output circuit) is constructed by a non-inverting buffer circuit, and outputs a non-inverted signal of the transmission data to a transmission line 20 (corresponding to a first transmission line) for connecting the protocol conversion portion 3 and the transceiver 4. On the other hand, the output circuit 16 (corresponding to the second output circuit) is constructed by an inverting buffer circuit (inverter circuit), and outputs an inverted signal of the transmission data to a transmission line 21 (corresponding to a second transmission line) for connecting the protocol conversion portion 3 and the transceiver 4. Capacitors 22 and 23 are interposed in the pair of transmission lines 20 and 21, respectively.

Likewise, a pair of transmission lines 24, 25 (corresponding to first and second transmission lines) constituting another transmission system exit between the transceiver 4 and the protocol conversion portion 3, and capacitors 26, 27 are interposed in the transmission lines 24, 25. The capacitor 18 of the protocol conversion portion 3 is connected between the transmission lines 24 and 25. One terminal of both the terminals of the capacitor 18 which is located at the transmission line 24 side is connected to the non-inverting input terminal of the comparator 17 (corresponding to a comparison circuit), and the other terminal at the transmission line 25 side is connected to the inverting input terminal. The comparator 17 compares the voltages at both the terminals of the capacitor 18, and the reception signal corresponding to the comparison result signal to the protocol conversion circuit 14.

Next, the construction of the transceiver 4 will be described.

The transceiver 4 under the floating state is connected to IC at the slave side (not shown) through communication lines 30, 31 (buses A, B) connected to the terminals 28, 29 of IC1 to carry out data communications. The transceiver 4 comprises a driving circuit 32, a reception circuit 33, a comparator 34 (corresponding to a comparison circuit), a capacitor 35, output circuits 36, 37 (corresponding to first and second output circuits) and a power supply circuit 38. The power supply circuit 38 is a non-insulated linear regulator, and generates a power supply voltage Vcc2 (for example, 14V) for operating the whole of the transceiver 4 from the power supply voltage 4.

Here, the connection of the comparator 34 and the capacitor 35 to the transmission lines 20, 21 is the same as the connection of the comparator 17 and the capacitor 18 to the transmission lines 24, 25 described above, and the connection of the output circuits 36, 37 to the transmission lines 24, 25 is the same as the connection of the output circuits 15, 16 to the transmission lines 20, 21 described above. The driving circuit 32 transmits the transmission data output from the comparator 34 to the communication lines 30, 31, and the reception circuit 33 receives the data transmitted from the communication lines 30, 31 and supplies the data to the output circuits 36, 37.

IC1 is equipped with the protocol conversion portion 3 and the transceiver 4 which are insulated from each other, and thus it is manufactured by a trench insulating separation process. FIG. 9 is a cross-sectional view showing the capacitors 18, 22, 23, 26, 27 and 35 constructed as IC. There is used an SOI (Silicon ON Insulator) substrate which is formed on a monocrystal silicon layer 41 (corresponding to the semiconductor layer) through an insulating separation layer 40 on a monocrystal silicon substrate 39 (support substrate), and plural island-like independent fields 43 (corresponding to element forming areas) surrounded by the insulating separation trenches 42 are formed in the monocrystal silicon layer 41. An inter-layer insulating film 45 (or wiring layer) is formed through an insulating separation layer 44 on the monocrystal silicon layer 41.

With respect to the capacitor 18 (the same is applied to the other capacitors), polysilicon or metal (for example, Al) thin film 46 (corresponding to a conductive film) formed on the insulating separation layer 44 or the inter-layer insulating film 45, and an N+ diffusion layer 47 formed on the surface layer portion of the monocrystal silicon layer 41 are set as counter electrodes, and the insulating film of the insulating separation layer 44 or the inter-layer insulating film 45 is used as a dielectric material between the electrodes. The N+ diffusion layer 47 is connected to the wiring layer through a contact 48.

Next, the action of the transmission circuit of this embodiment will be described with reference to FIGS. 10A–10G.

The master-side IC1 used while connected to the microcomputer IC at the host side and the slave-side IC (not shown) used while connected to a device at the peripheral side carry out two-way communications through the communication lines 30, 31. The transceiver 4 is kept to be floated from the microcomputer IC together with the communication lines 30, 31, and thus it is needed to carry out data transmission while the protocol conversion portion 3 and the transceiver 4 are insulated from each other in IC1. In the following description, a case in which data is transmitted from the protocol conversion portion 3 to the transceiver 4 by using the transmission lines 20, 21 will be described. The same is applied to a case where data is transmitted from the transceiver 4 to the protocol conversion portion 3 by using the transmission lines 24, 25.

FIGS. 10A–10G show voltage waves of ground potential and the respective signals concerning the data transmission. Particularly, the ground potential VG1 of the protocol conversion portion 3, the ground potential VG2 of the transceiver 4, a transmission data signal VA output from the protocol conversion circuit 14 (the same as the output signal of the output circuit 15), an output signal VC of the output circuit 16, a non-inverted input signal VD of the comparator 34, an inverted input signal VE of the comparator 34, and an output signal VF of the comparator (corresponding to the transmitted signal) are shown in this order. The signals VA, VB, VC are represented with the ground potential VG1 as a reference potential, and the signals VD, VE, VF are represented with the ground potential VG2 as a reference potential. In this case, it is assumed that a collision accident of a vehicle occurs at a time t1 during transmission and the communication line 30 (bus A) is short-circuited to the vehicle (which is at earth or ground potential).

When the transmission data signal VA is set to H level, the output circuit 15 outputs the transmission data signal VB of 5V, and the output circuit 16 outputs the output signal VC of 0V. The differential voltage therebetween is applied to a series circuit comprising the capacitor 22 provided to the transmission line 20, the capacitor 35 provided between the transmission lines 20, 21 and the capacitor 23 provided to the transmission line 21, and a divided voltage occurs between the terminals of the capacitor 35.

The divided voltage is uniquely determined by the differential voltage and the electrostatic capacitance values of the capacitors 22, 23, 35, and it is not influenced by the potential difference between the ground potential VG1 of the protocol conversion portion 3 and the ground potential VG2 of the transceiver 4. In this example, the transmission line 20 side of the capacitor 35 is set to high potential, and the transmission line 21 side is set to low potential. Therefore, the comparator 34 outputs the output signal VF of H level. Likewise, when the transmission data signal VA is set to L level, the comparator 34 outputs the output signal VF of L level.

When the ground potential VG2 is stepwise lowered at the time t1, the potential of the non-inverted input signal VD and the potential of the inverted input signal VE of the comparator 34 which are viewed with respect to the ground potential VG2 as a reference are relatively increased. However, the charge of the capacitor 35 itself is not varied, and the inter-terminal voltage of the capacitor 35 is not varied, so that the comparator 34 continues to output the same output signal VF as that before the variation irrespective of the variation of the ground potential VG2.

As described above, in the transmission circuit of this embodiment, the protocol conversion portion 3 and the transceiver 4 are insulated from each other by interposing the capacitors 22, 23, 26, 27 in the transmission lines 20, 21, 24, 25 respectively, and the series circuit comprising the capacitors 22, 35, 23 is constructed between the output circuits 15, 16 to compare the voltages at both the terminals of the second capacitor 35 and achieve the transmitted data. In addition, the series circuit comprising the capacitors 26, 18 and 27 is constructed between the output circuits 36, 37 to compare the voltages at both the terminals of the second capacitor 18 and achieve the transmitted data. Accordingly, the two-way data transmission can be performed between the protocol conversion portion 3 and the transceiver 4 which have different power supply systems and are insulated from each other.

The divided voltages whose direction and magnitude correspond to the transmission data are generated in the capacitors 35, 18 provided at the transmitted side by the voltage dividing action of the capacitors in the series circuit, and thus the data can be transmitted normally even when the reference potential (ground potential VG1) of the protocol conversion portion 3 or the reference potential (ground potential VG2) of the transceiver 4 is varied. The capacitor has a filtering action for removing noise or the like, and thus even when noise invades from the external or the reference potential sharply varies, there remarkably hardly occurs the malfunction that the direction of the voltage between the terminals of the capacitors 35, 18 is inverted.

IC1 is constructed by using the SOI substrate, and the capacitors 18, 22, 23, 26, 27, 35 are formed not by the junction separation process, but by the oxide film separation process. Therefore, leakage current under high temperature can be more greatly reduced as compared with the capacitor formed by the junction separating process. Both the terminal portions of the capacitors 18, 35 have high impedance, and thus the deterioration of the transmission signal can be improved by the reduction of the leakage current. Furthermore, the parasitic capacitance can be also reduced, and thus signal deterioration occurring through the transmission can be suppressed. Even when the electrostatic capacitance values of the capacitors 18, 22, 23, 26, 27 and 35 are slightly displaced from design values, the transmission characteristic is not deteriorated.

Eighth Embodiment

Next, an eighth embodiment will be described with reference to FIG. 11.

Figure 11:
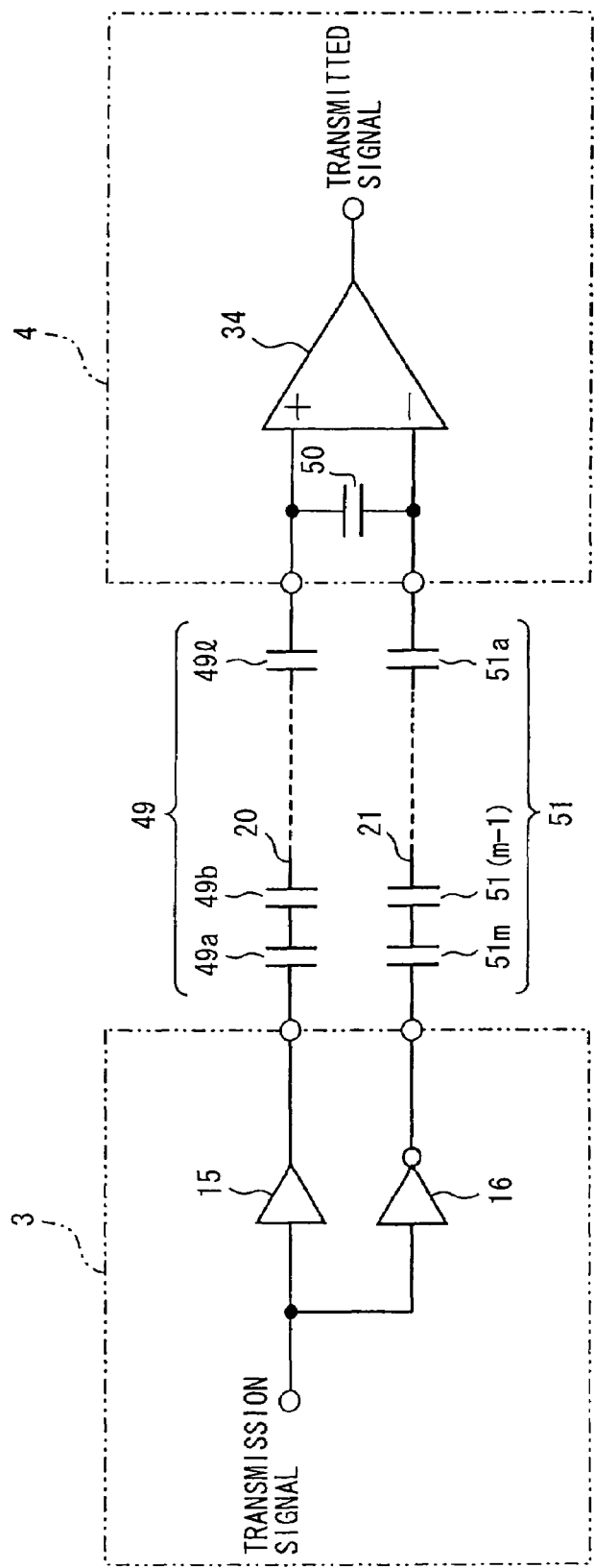
FIG. 11 is a diagram showing the construction of a main part of the transmission circuit according to an eighth embodiment.

FIG. 11 shows a modification of the transmission circuit used in the communication circuit shown in FIG. 8, and shows only the transmission circuit portion from the protocol conversion portion 3 to the transceiver 4. The same constituent parts as FIG. 8 are represented by the same reference numerals.

N (N≧3) capacitors 49a, 49b, . . . , 49l, 50, 51a, . . . , 51(m−1) and 51m (corresponding to first to N-th capacitors) are connected in series between the output terminal of the output circuit 15 and the output terminal of the output circuit 16. Here, the relationship of 1+1+m=N is satisfied. The capacitors 49a, 49b, . . . , 49l (l≧1) are connected in series in the transmission line 20, and the capacitors 51a, . . . , 51(m−1), 51m are connected in series in the transmission line 21. In the case where l=1 and m=1, it corresponds to the seventh embodiment.

The transmission circuit of this embodiment has the same action and effect as the seventh embodiment in the data transmission. Furthermore, when plural capacitors are provided in series in the transmission lines 20, 21 with l≧2, m≧2, the withstanding voltage can be increased even when the thickness of the insulating film of each capacitor 49a, . . . , 51a, . . . is small, and the breakdown withstand voltage of IC can be increased. As a result, high reliability can be secured even when the transmission device is used under the operation environment that the potential difference between the protocol conversion portion 3 and the transceiver 4 is large or under the operation environment that a high noise voltage invades. With respect to the capacitor 50, plural capacitors may be connected in series. Furthermore, with respect to only the capacitor 50, plural capacitors may be connected in series with l=1 and m=1.

FIGS. 12 to 16 show an embodiment in which the structure of the capacitors 18, 22, 23, 26, 27, 49 (49a, 49b, . . . , 49l), 50, 51 (51a, . . . , 51(m−1), 51m) used for the transmission circuit of the first or second embodiment is modified, and the same constituent parts are represented by the same reference numerals. The action and effect as the transmission circuit are the same as the seventh or eighth embodiment.

Ninth Embodiment

Figure 12:
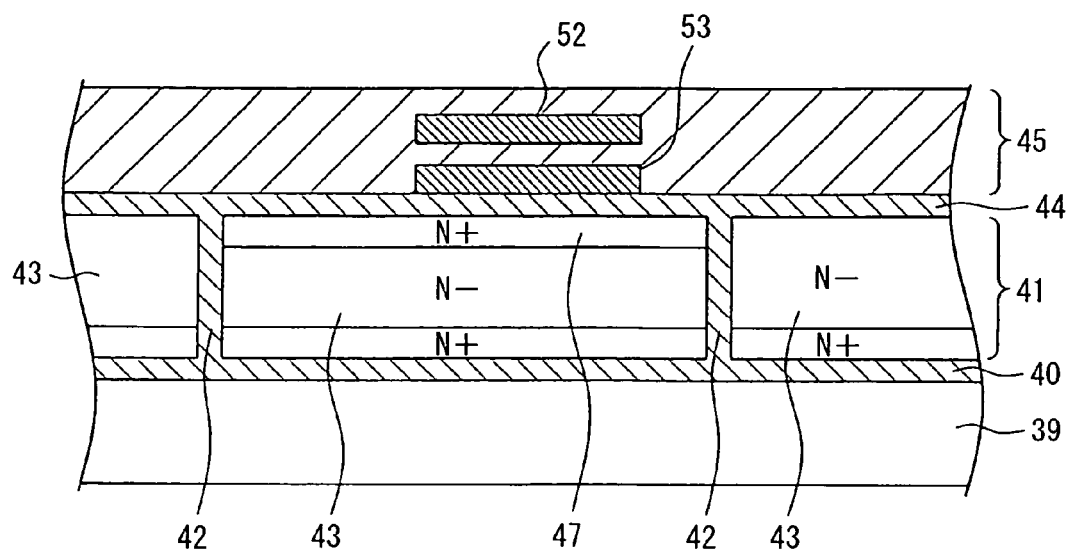
FIG. 12 is a diagram corresponding to FIG. 9, which shows a ninth embodiment.

FIG. 12 is a longitudinally-sectional view showing a capacitor according to a ninth embodiment. The capacitor uses thin films 52 and 53 (corresponding to conductive films) of polysilicon or metal (for example, Al) formed on an interlayer insulating film 45 (or wiring layer) as counter electrodes, and also uses the interlayer insulating film 45 as an dielectric material between the electrodes. This structure also provides the same action and effect as the capacitor shown in FIG. 9.

Tenth Embodiment

Figure 13:
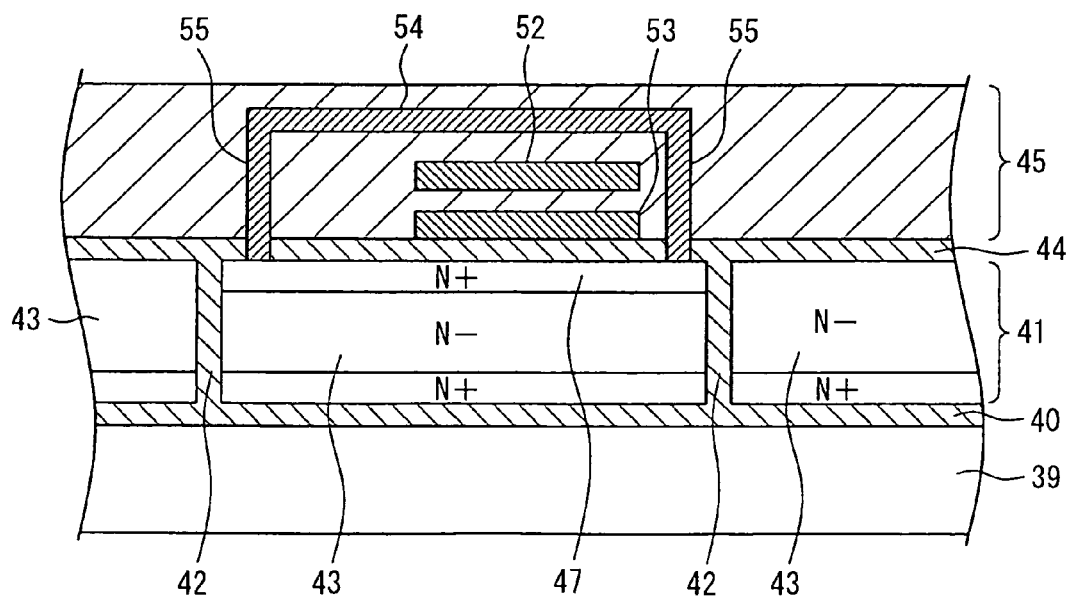
FIG. 13 is a diagram corresponding to FIG. 9, which shows a tenth embodiment.

FIG. 13 is a longitudinally-sectional view showing a capacitor according to a tenth embodiment. In the interlayer insulating film 45 (or wiring layer), a thin film 54 (corresponding to a shield conductive layer) of polysilicon or metal (for example, Al) is formed above the thin film 52 so as to cover the whole of the thin film 52. On the other hand, an N+ diffusion layer 47 formed through the insulating separation layer 44 below the thin film 53 serving as the electrode of the capacitor is electrically connected to the thin film 54 by a contact 55.

The conductive thin film 54 and the N+ diffusion layer 47 are connected to a circuit portion having low impedance, and the thin film 54 and the N+ diffusion layer 47 have stable potential under the operating state of IC. The low-impedance circuit portion is the power supply line of the protocol conversion portion 3 shown in FIG. 8 (the power supply potential Vcc or the ground potential VG1), the power supply line of the transceiver 4 (the power supply potential Vcc2 or the ground potential VG2), the output terminals of the output circuits 15, 16, 36, 37 or the output terminals of the comparators 17, 34.

In general, the area of the capacitor is larger than the area of the wire, and thus it is more liable to be influenced by noises in the IC chip. Furthermore, as described above, both the terminal portions of the capacitors 18, 35 shown in FIG. 8 have high impedance, and thus they are liable to be influenced by noises. On the other hand, if the structure of this embodiment is adopted, the capacitors are electrostatically shielded and thus the variation of the inter-terminal voltage due to invasion of noises can be reduced, so that the noise withstanding resistance of IC containing the transmission circuit described above can be increased.

Eleventh Embodiment

Figure 14:
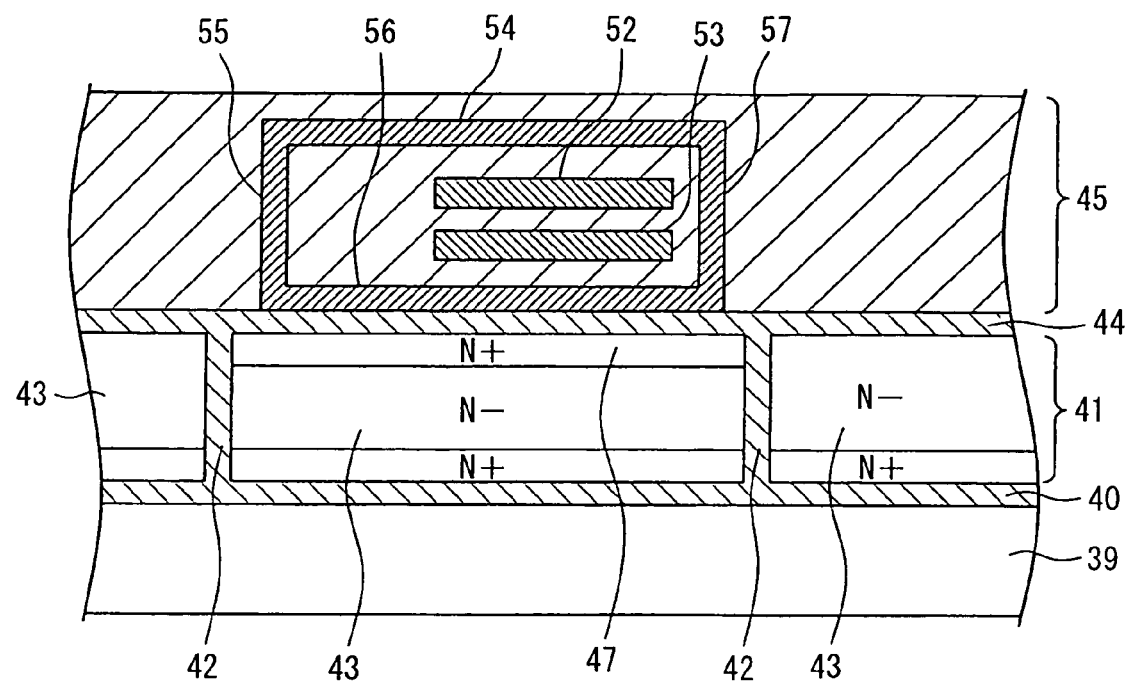
FIG. 14 is a diagram corresponding to FIG. 9, which shows a eleventh embodiment.

FIG. 14 is a cross-sectional view showing a capacitor according to an eleventh embodiment.

In the interlayer insulating film 45 (or wiring layer), polysilicon or metal (for example, Al) thin film 56 (corresponding to shield conductive layer) is formed below the thin film 53 serving as the electrode of the capacitor so as to cover the whole of the thin film 53 from the lower side. The thin films 54 and 56 are electrically connected to a via 57.

These conductive thin films 54 and 56 are connected to the low impedance circuit portion, and the thin films 54 and 56 under the operating state of IC have stable potential. By designing the capacitor so that it is sandwiched between the thin films 54 and 55 as described above, the same shield action as the tenth embodiment can be achieved, and the variation of the voltage between the terminals of the capacitor due to invasion of noises can be reduced.

Twelfth Embodiment

Figure 15A:
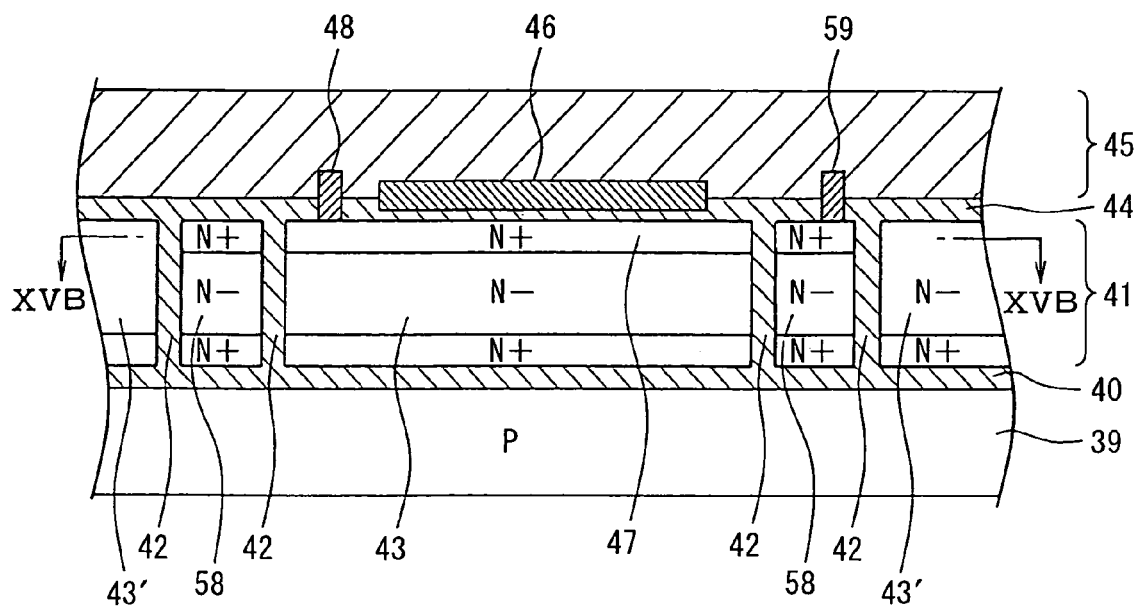
Figure 15B:
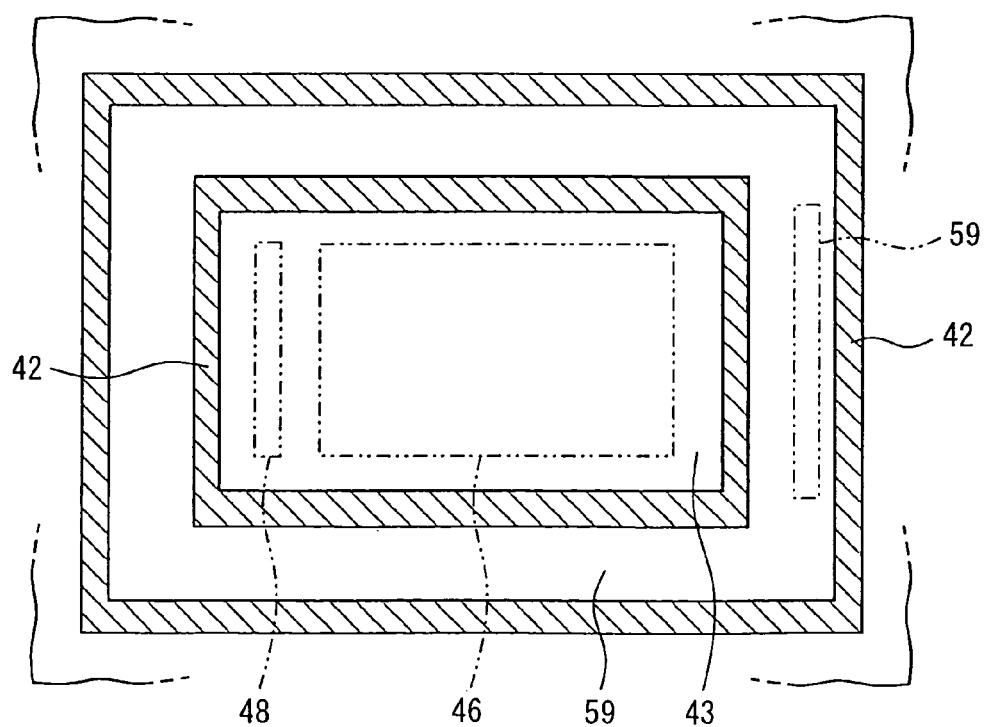

FIG. 15A shows a cross-sectional view of a capacitor according to a twelfth embodiment and FIG. 15b shows a longitudinally-sectional view taken along line XVB—XVB line of FIG. 15A. In FIG. 15B, a thin film 46 constituting the electrode of the capacitor and contacts 48, 59 are indicated at the corresponding positions by two-dotted chain lines.

In FIGS. 15A–15B, a buffer area 58 is formed between a island-like independent field 43 having a capacitor formed therein and a neighboring independent field 43' so as to surround the independent field 43. An insulating separation trench 42 is formed between the buffer area 58 and the independent field 43, 43'. The buffer area 58 is connected to the wire layer through the contact 59, and it is supplied with stable potential under the operating state.

The independent field 43 in which the N+ diffusion layer 47 serving as one electrode of the capacitor is slightly capacitance-coupled with the neighboring independent field 43'. Therefore, an AC component of the potential of the neighboring independent field 43' may be transmitted to the capacitor. On the other hand, according to this embodiment, the independent field 43 in which the capacitor is formed is electrostatically shielded from the neighboring independent field 43', and thus deterioration of the transmission signal can be reduced.

Thirteenth Embodiment

Figure 16A:
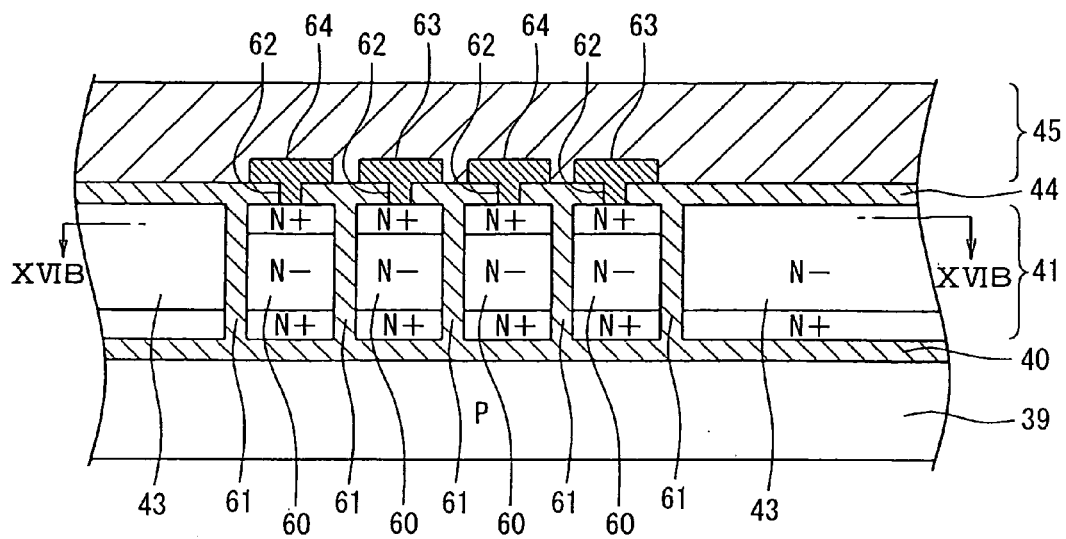
Figure 16B:
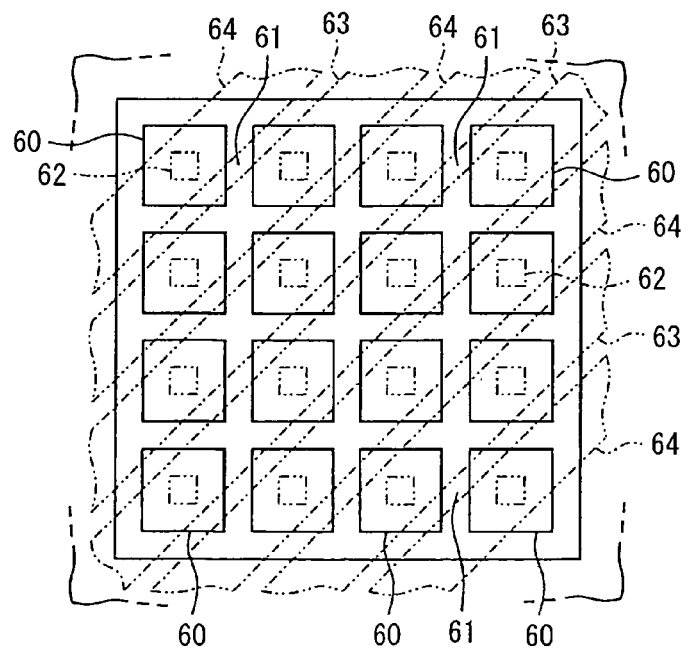

FIG. 16A is a cross-sectional view of a capacitor according to a thirteenth embodiment and FIG. 16B is a longitudinally-sectional view taken along line XVIB—XVIB of FIG. 16A. In FIG. 16B, contacts 62 and electrodes 63, 64 are indicated at the corresponding positions by two-dotted chain lines.

In FIGS. 16A–16B, plural independent fields 60 (corresponding to semiconductor areas) each having a square cross-section are formed in the monocrystal silicon layer 41 so as to be sectioned in a matrix form. The independent fields 60 are insulated and separated from one another by insulating separation trenches 42. A buried diffusion layer (N+ diffusion layer), an N-diffusion layer and an N+ diffusion layer are formed from the lower side in this order in each independent field 60, and function as the electrode of the capacitor. Furthermore, the insulating separation trench 61 (corresponding to the element separation area) between the neighboring independent fields 60 functions as the dielectric material of the capacitor. That is, the capacitor (corresponding to the unit capacitor) is formed of the neighboring independent fields 60 and the insulating separation trench 61 sandwiched therebetween.

Each independent field 60 is connected to the electrode 63 or the electrode 64 through the contact 62. In this case, the electrodes 63, 64 are formed so as to be inclined to the column direction or the line direction at an angle of 45 degrees so that the neighboring independent fields 60 adjacent along the column direction or the line direction are connected to different electrodes. The unit capacitors are connected in series-parallel through the electrodes 63 and 64.

According to this construction, the number of the series connection of the unit capacitors can be increased by increasing the planar dimension, and thus the withstanding voltage of the capacitor can be increased. Furthermore, the parallel connection number of the unit capacitors can be increased and the electrostatic capacitance of the capacitor can be increased. The sufficient insulating withstanding resistance can be secured between the protocol conversion portion 3 and the transceiver 4 by using the capacitor of this embodiment for the transmission circuit between the protocol conversion portion 3 and the transceiver 4 shown in FIG. 8. The shape of the independent fields 60 is not limited to a square shape, and it may be rectangular, hexagonal or the like.

Fourteenth Embodiment

Next, a fourteenth embodiment will be described with reference to FIG. 17.

Figure 17:
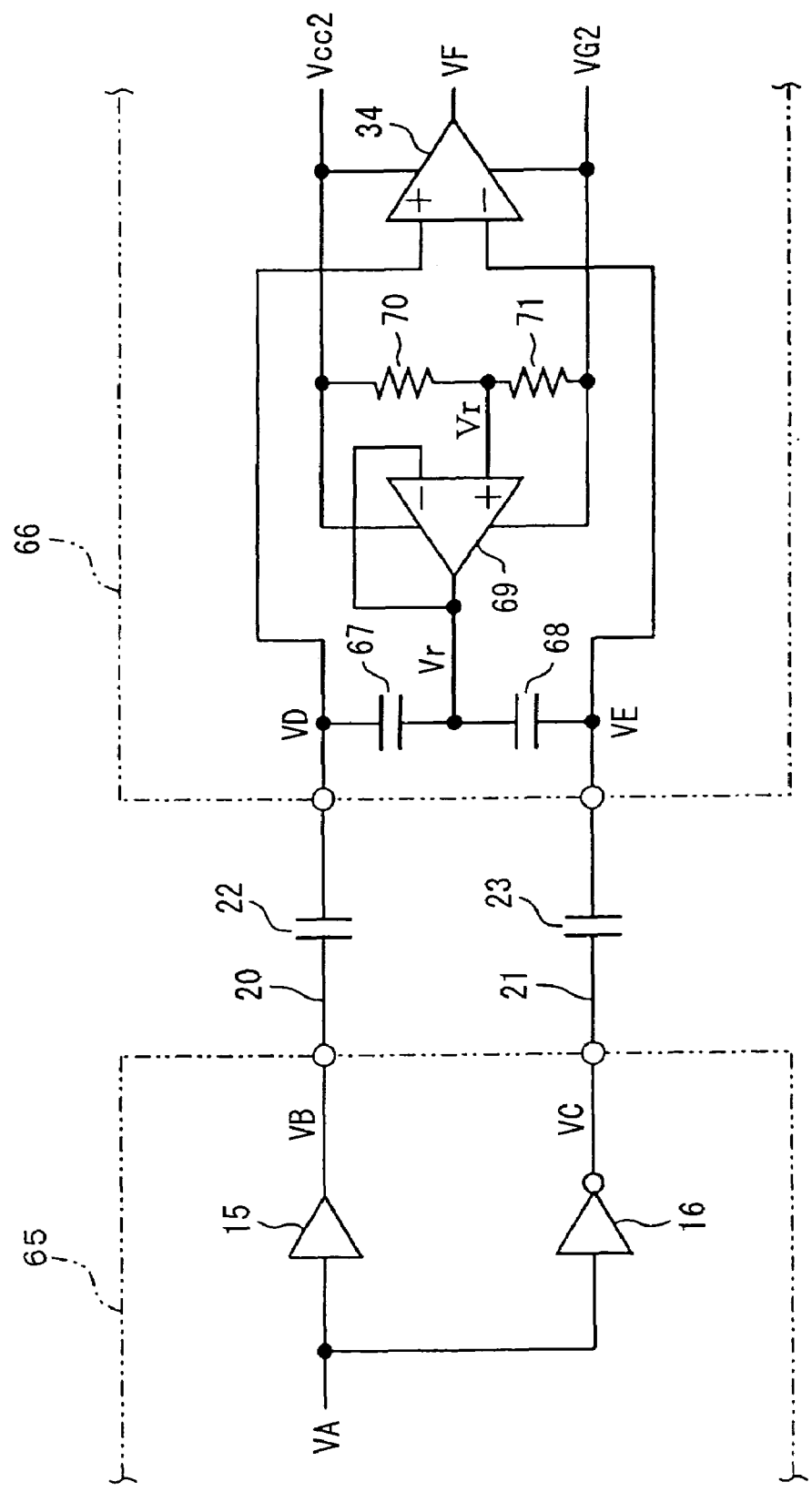
FIG. 17 is a diagram corresponding to FIG. 11, which shows an fourteenth embodiment.

FIG. 17 shows an embodiment in which the transmission circuit in the communication circuit shown in FIG. 8 is modified, and it shows only the transmission circuit portion from a protocol conversion portion 65 to a transceiver 66. Furthermore, the same constituent parts as FIG. 8 are represented by the same reference numerals.

In the transceiver 66, capacitors 67 and 68 are connected in series between the transmission lines 20 and 21. Resistors 70 and 71 divide the power supply voltage Vcc2 to generate a reference voltage Vr. The reference voltage Vr is applied to the common connection point between the capacitors 67 and 68 through an operation amplifier 69 (corresponding to a reference potential setting circuit) having a voltage follower style. It is preferable that the reference voltage Vr is set to a value around the center value of the in-phase input voltage range of the comparator 34, and in this embodiment the resistance values of the resistors 70 and 71 are set to be equal to each other. As not shown, the transmission circuit from the transceiver 66 to the protocol conversion portion 65 is likewise constructed.

According to this construction, in the series circuit comprising the capacitor 22 provided in the transmission line 20, the capacitors 67 and 68 connected between the transmission lines 20 and 21 and the capacitor 23 provided in the transmission line 21, the potential at the common connection point between the capacitors 67 and 68 is fixed to the reference voltage Vr under the power supply system of the transceiver 66. Accordingly, even under the transient state that the potential between the protocol conversion portion 65 and the transceiver 66 is varied, the magnitude relationship between the non-inverted input signal VD and the inverted input signal VE of the comparator 34 is settled by the output signals VB and VC from the output circuits 15 and 16. Accordingly, the two-way data transmission can be stably performed between the protocol conversion portion 65 and the transceiver 66. Furthermore, the non-inverted input signal VD and the inverted input signal VE can be set within the in-phase input voltage range of the comparator 34.

Fifteenth Embodiment

Next, a fifteenth embodiment will be described with reference to FIGS. 18 and 19.

Figure 18:
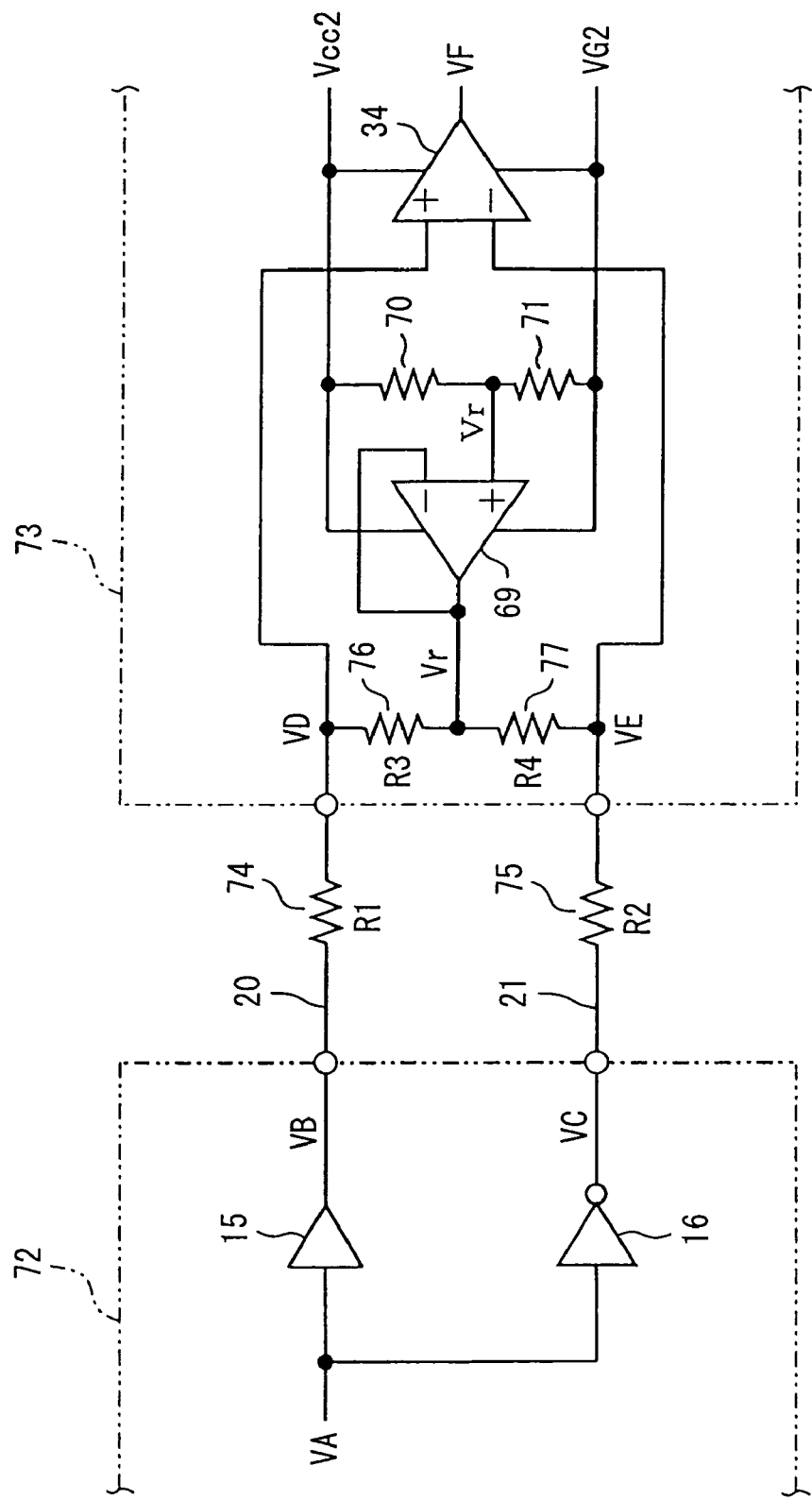
FIG. 18 is a diagram corresponding to FIG. 11, which shows a fifteenth embodiment.
Figure 19:
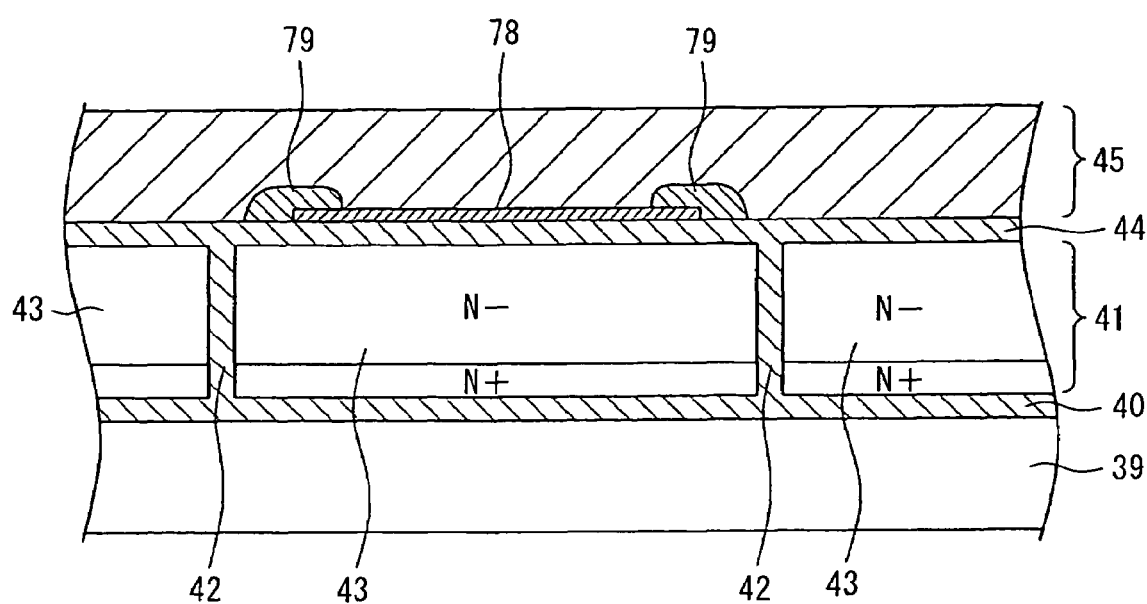
FIG. 19 is a cross-sectional view showing resistors constructed as IC.

The transmission circuit shown in FIG. 18 is achieved by modifying the transmission circuit used in the communication circuit shown in FIG. 8, and only the transmission circuit portion from a protocol conversion portion 72 to a transceiver 73 is shown. The same constituent parts as shown in FIGS. 8 and 18 are represented by the same reference numerals.

Resistors 74 and 75 are interposed in the transmission lines 20, 21 in place of the capacitors. In the transceiver 73, resistors 76 and 77 are connected in series between the transmission lines 20 and 21, and the output terminal of an operational amplifier 69 is connected to the common connection point between the resistors 76 and 77. As not shown, the transmission circuit from the transceiver 73 to the protocol conversion portion 72 is likewise constructed.

The resistors 74 to 77 are constructed by thin film resistors or polycrystalline silicon resistors. FIG. 19 is a longitudinally-sectional view showing the thin film resistor. A metal thin film 78 of CrSi or NiCr is formed on the insulating separation layer 44 by deposition, and both the end portions thereof are connected to each other through an aluminum wire 79. The thin film resistor or the polycrystalline silicon resistor has small parasitic capacitance, and thus high-speed signal transmission can be performed.

According to this embodiment, the differential voltage output from the output circuits 15 and 16 is applied to the series circuit comprising the resistor 74 provided to the transmission line 20, the resistors 76 and 77 connected between the transmission lines 20 and 21 and the resistor 75 provided to the transmission line 21, and a divided voltage occurs between both the terminals of the series circuit of the resistors 76 and 77. The divided voltage is uniquely determined by the differential voltage and the resistance values of the resistors 74 to 77, and it is not influenced by the potential difference between the ground potential VG1 of the protocol conversion portion 72 and the ground potential VG2 of the transceiver 73. The voltage waveforms of the respective signals are shown in FIGS. 10A–10G.

In the series circuit comprising the resistors 74, 76, 77 and 75, the potential at the common connection point between the resistors 76 and 77 is fixed to the reference voltage Vr under the power supply system of the transceiver 73. Accordingly, even when the potential relationship between the protocol conversion portion 72 and the transceiver 73 is varied by noise or the like, the magnitude relationship between the voltages input to the comparator 34 is kept. Accordingly, the data transmission can be more stably performed. By setting the reference voltage Vr within the in-phase voltage range of the comparator 34, the non-inverted input signal VD and the inverted input signal VE can be set within the in-phase input voltage range of the comparator 34.

Furthermore, in this embodiment, when the resistance values of the resistors 74, 75, 76, 77 are represented by R1, R2, R3, R4, it is preferable that the resistance values are set so as to establish the relationship of R3/R1 R4/R2. In this case, even under the transient state that the potential relationship between the protocol conversion portion 72 and the transceiver 73 is varied, there can be kept the magnitude relationship between the non-inverted input signal VD of the comparator 34 which is determined by the output voltage of the output circuit 15 and the reference voltage Vr and the inverted input signal VE of the comparator 34 which is determined by the output voltage of the output circuit 15 and the reference voltage Vr. Accordingly, even under the transient state that the potential variation occurs, signals can be surely transmitted between the protocol conversion portion 72 and the transceiver 73.

Other Embodiments

The present invention is not limited to the above embodiments described above and shown in the figures, and for example, the following modification and expansion are possible.

The transmission circuit described above may be applied to the transmission between different integrated circuits or between different discrete circuits.

For example, in the series circuit of the capacitors 22, 35 and 23, the electrostatic capacitance values of the capacitors may be equal to or different from one another.

In the fourteenth embodiment, the two capacitors 67 and 68 are connected in series between the transmission lines 20 and 21, however, more capacitors may be connected in series. In this case, the reference voltage Vr may be applied to any one of the connection points of the series-connected capacitors. The same is applied to the fifteenth embodiment.

In the fourteenth embodiment, when the electrostatic capacitance values of the capacitors 22, 23, 67 and 68 are represented by C1, C2, C3, C4, the respective capacitance values are preferably set to as to establish the relationship of C1/C3=C2/C4.

The invention claimed is:

1. A transmission device for transmitting signals from a first circuit block having a first power supply system through a transmission line to a second circuit block having a second power supply system, said transmission device comprising:
    the transmission line comprises a first transmission line and a second transmission line;
    the first circuit block comprises a first output circuit for outputting a non-inverted signal of the transmission signal to the first transmission line, and a second output circuit for outputting an inverted signal of the transmission signal to the second transmission line;
    the second circuit block comprises an impedance element connected between the first transmission line and the second transmission line, and a comparison circuit for comparing voltages at both the terminals of the impedance element and outputting a transmitted signal; and
    the same types of impedance elements as the impedance element are interposed in the first and second transmission lines between the first circuit block and the second circuit block.

2. The transmission device according to claim 1, wherein the impedance elements connected between the first transmission line and the second transmission line comprise plural impedance elements connected in series, and a reference potential setting circuit for applying reference potential of the second power supply system to any one of connection points of the plural impedance elements is provided.

3. The transmission device according to claim 2, wherein when the impedance values of the impedance elements interposed in the first and second transmission lines are represented by Z1 and Z2 and the impedance values of the impedance elements between the first and second transmission lines and the connection point supplied with the reference potential are represented by Z3 and Z4, the relationship of Z3/Z1=Z4/Z2 is established.

4. The transmission device according to claim 1, wherein the transmission device is constructed as a semiconductor integrated circuit device having a trench insulating separation structure, the impedance element comprises a capacitor, and the capacitor is constructed by using an insulating film formed on a semiconductor layer as a dielectric material between electrodes.

5. The transmission device according to claim 4, wherein the electrodes of the capacitor is constructed by a conductive film formed on the semiconductor layer and a diffusion layer in the semiconductor layer, and a buffer area which is insulated and separated by a trench is formed between an element forming area having the capacitor formed therein and another element forming area in the semiconductor layer, the buffer area being supplied with predetermined potential under the operating state.

6. The transmission device according to claim 4, wherein the electrodes of the capacitor are constructed by a pair of conductive films formed on the semiconductor layer, and the capacitor is formed between a shield conductive layer formed on the semiconductor layer and a diffusion layer in the semiconductor layer, predetermined potential being applied to the shield conductive layer and the diffusion layer under the operating state.

7. The transmission device according to claim 4, wherein the electrodes of the capacitor is constructed by a pair of conductive film formed on the semiconductor layer, and the capacitor is formed between a pair of shield conductive layers formed on the semiconductor layer, predetermined potential being applied to the shield conductive layers under the operating state.

8. The transmission device according to claim 1, wherein the transmission device is constructed as a semiconductor integrated circuit device having a trench insulating separation structure, the impedance element comprises a capacitor, and the capacitor is constructed so that plural semiconductor areas which are designed like islands so as to be insulated and separated from one another in the semiconductor layer are used as electrodes and an element separation area provided between the semiconductor areas is used as a dielectric material.

9. The transmission device according to claim 8, wherein the semiconductor areas are continuously formed in the semiconductor layer, and the capacitor is constructed so that unit capacitors comprising neighboring semiconductor areas are connected in series-parallel.

10. The transmission device according to claim 1, wherein the transmission device is constructed as a semiconductor integrated circuit device having a trench insulating separation structure, and the impedance element comprises a resistor.

11. The transmission device according to claim 10, wherein the resistor comprises a thin film resistor or polycrystalline silicon resistor.

12. A transmission device for transmitting signals from a circuit block operating under a first power supply system to a circuit block operating under a second power supply system, said transmission device comprising:
    a first output circuit for outputting a non-inverted signal of the transmission signal under the first power supply system;
    a second output circuit for outputting an inverted signal of the transmission signal under the first power supply system;
    first to N-th (N>3) impedance elements connected in series between the output terminal of the first output circuit and the output terminal of the second output circuit; and
    a comparison circuit for comparing voltages at both the terminals of any one impedance element of second to (N−1)-th impedance elements or at both the terminals of an impedance group of two or more series-connected impedance elements out of the second impedance element to the (N−1)-th impedance element, and outputting a transmitted signal.

13. The transmission device according to claim 12, wherein the transmission device is constructed as a semiconductor integrated circuit device having a trench insulating separation structure, the impedance element comprises a capacitor, and the capacitor is constructed by using an insulating film formed on a semiconductor layer as a dielectric material between electrodes.

14. The transmission device according to claim 13, wherein the electrodes of the capacitor is constructed by a conductive film formed on the semiconductor layer and a diffusion layer in the semiconductor layer, and a buffer area which is insulated and separated by a trench is formed between an element forming area having the capacitor formed therein and another element forming area in the semiconductor layer, the buffer area being supplied with predetermined potential under the operating state.

15. The transmission device according to claim 13, wherein the electrodes of the capacitor are constructed by a pair of conductive films formed on the semiconductor layer, and the capacitor is formed between a shield conductive layer formed on the semiconductor layer and a diffusion layer in the semiconductor layer, predetermined potential being applied to the shield conductive layer and the diffusion layer under the operating state.

16. The transmission device according to claim 13, wherein the electrodes of the capacitor is constructed by a pair of conductive film formed on the semiconductor layer, and the capacitor is formed between a pair of shield conductive layers formed on the semiconductor layer, predetermined potential being applied to the shield conductive layers under the operating state.

17. The transmission device according to claim 12, wherein the transmission device is constructed as a semiconductor integrated circuit device having a trench insulating separation structure, the impedance element comprises a capacitor, and the capacitor is constructed so that plural semiconductor areas which are designed like islands so as to be insulated and separated from one another in the semiconductor layer are used as electrodes and an element separation area provided between the semiconductor areas is used as a dielectric material.

18. The transmission device according to claim 17, wherein the semiconductor areas are continuously formed in the semiconductor layer, and the capacitor is constructed so that unit capacitors comprising neighboring semiconductor areas are connected in series-parallel.

19. The transmission device according to claim 12, wherein the transmission device is constructed as a semiconductor integrated circuit device having a trench insulating separation structure, and the impedance element comprises a resistor.

20. The transmission device according to claim 19, wherein the resistor comprises a thin film resistor or polycrystalline silicon resistor.

* * * * *

UNITED STATES PATENT AND TRADEMARK OFFICE
CERTIFICATE OF CORRECTION

PATENT NO. : 7,248,061 B2
APPLICATION NO. : 11/220527
DATED : July 24, 2007
INVENTOR(S) : Kiyoshi Yamamoto It is certified that error appears in the above-identified patent and that said Letters Patent is hereby corrected as shown below:

Title page

Correct Item (75), Should read as Inventor:   Kiyoshi Yamamoto, Toyohashi (JP)

Signed and Sealed this

Eleventh Day of March, 2008

JON W. DUDAS
*Director of the United States Patent and Trademark Office*